(12) United States Patent
Shimayama

(10) Patent No.: US 9,231,037 B2
(45) Date of Patent: Jan. 5, 2016

(54) DISPLAY UNIT AND ELECTRONIC APPARATUS

(71) Applicant: JOLED Inc., Tokyo (JP)

(72) Inventor: Tsutomu Shimayama, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 14/487,743

(22) Filed: Sep. 16, 2014

(65) Prior Publication Data

US 2015/0108512 A1    Apr. 23, 2015

(30) Foreign Application Priority Data

Oct. 23, 2013   (JP) ................................. 2013-220340

(51) Int. Cl.
*H01L 33/00*   (2010.01)
*H01L 27/32*   (2006.01)
*H01L 51/52*   (2006.01)

(52) U.S. Cl.
CPC .......... *H01L 27/3253* (2013.01); *H01L 51/525* (2013.01); *H01L 51/5228* (2013.01); *H01L 27/322* (2013.01)

(58) Field of Classification Search
CPC ... H01L 25/0753; H01L 27/153; H01L 33/00; H01L 33/62
USPC .................................. 257/88, 79, 99; 438/26
See application file for complete search history.

(56) References Cited

U.S. PATENT DOCUMENTS

| | | | | |
|---|---|---|---|---|
| 2011/0108877 A1* | 5/2011 | Yamada et al. | .................. | 257/99 |
| 2013/0221341 A1* | 8/2013 | Iwabuchi et al. | ................ | 257/40 |
| 2013/0334958 A1* | 12/2013 | Aoki et al. | ...................... | 313/504 |
| 2014/0339521 A1* | 11/2014 | Ozawa | ............................ | 257/40 |

FOREIGN PATENT DOCUMENTS

JP      2002-033198      1/2002

* cited by examiner

*Primary Examiner* — Phuc Dang
(74) *Attorney, Agent, or Firm* — Michael Best & Friedrich LLP

(57) ABSTRACT

A display unit includes a first substrate and a second substrate opposed to each other, a display element having a first electrode and a second electrode on the first substrate, an auxiliary electrode provided on a surface facing the first substrate of the second substrate, and including a plurality of films stacked in a direction from the second substrate to the first substrate, and a plurality of pillars configured to electrically connect the auxiliary electrode to the second electrode.

20 Claims, 28 Drawing Sheets

DISPLAY UNIT AND ELECTRONIC APPARATUS

CROSS REFERENCE TO RELATED APPLICATIONS

This application claims the benefit of Japanese Priority Patent Application JP 2013-220340 filed Oct. 23, 2013, the entire contents of which are incorporated herein by reference.

BACKGROUND

The present disclosure relates to a display unit and an electronic apparatus having a display element such as an organic light emitting element or the like.

Recently, an organic EL display, in which a self-luminous organic light emitting element including an organic layer is used as a display element, has been practically used. The organic EL display is a self-luminous display, and therefore has a wide viewing angle compared with, for example, a liquid crystal display, etc., and has sufficient response even to a high definition, high-speed video signal.

Previously, the organic light emitting element has been tried to be improved in display performance by controlling light generated by a light emitting layer, such as improving color purity of an emission color and/or luminous efficiency through introducing a resonator structure. For example, the organic light emitting element may adopt a structure where a first electrode, an organic layer, and a second electrode are stacked in order on a first substrate via a drive circuit including a drive transistor and the like. In an organic light emitting element of a top emission type, the second electrode is configured of a transparent conductive material, light from the organic layer is multiply reflected between the first and second electrodes, and the light is extracted through a second substrate opposed to the first substrate. The transparent conductive material used for the second electrode in general has a resistance value higher than a metal material. In a relatively large organic light emitting display unit, therefore, display performance may be gradually degraded along a direction from an end region to a central region of a display section due to an effect of voltage drop. If thickness of the second electrode is increased, a resistance value is lowered and voltage drop is reduced in a display plane, but visible light transmittance of the second electrode is lowered, resulting in lowering of light extraction efficiency of the light emitting element.

To overcome such a difficulty, there has been proposed a technique where an auxiliary electrode is provided on the second substrate, and the auxiliary electrode is electrically connected to the second electrode of the organic light emitting element, thereby voltage drop of the second electrode is reduced (for example, see Japanese Unexamined Patent Application Publication No. 2002-33198). For example, the auxiliary electrode may be electrically connected to the second electrode of the organic light emitting element via conductive pillars.

SUMMARY

However, when such pillars are formed, other components may be affected thereby. For example, if lengths of a plurality of pillars are different from one another, a relatively long pillar may be strongly in contact with each of the first and second substrates, leading to a possibility of damage to the substrates.

It is desirable to provide a display unit and an electronic apparatus configured to reduce damage to other components due to pillar formation.

According to an embodiment of the present technology, there is provided a display unit (1), including a first substrate and a second substrate opposed to each other, a display element having a first electrode and a second electrode on the first substrate, an auxiliary electrode provided on a surface facing the first substrate of the second substrate, and including a plurality of films stacked in a direction from the second substrate to the first substrate, and pillars configured to electrically connect the auxiliary electrode to the second electrode.

According to an embodiment of the present technology, there is provided an electronic apparatus (1) including a display unit, the display unit including a first substrate and a second substrate opposed to each other, a display element having a first electrode and a second electrode on the first substrate, an auxiliary electrode provided on a surface facing the first substrate of the second substrate, and including a plurality of films stacked in a direction from the second substrate to the first substrate, and a plurality of pillars configured to electrically connect the auxiliary electrode to the second electrode.

In the display unit (1) and the electronic apparatus (1) each according to the above-described embodiment of the present technology, since the auxiliary electrode is configured of the plurality of films being stacked, when the auxiliary electrode is brought in contact with the second electrode of the display element via the pillars, shock is gradually attenuated while being transferred through the respective films configuring the auxiliary electrode.

According to an embodiment of the present technology, there is provided a display unit (2), including a first substrate and a second substrate opposed to each other, a display element having a first electrode and a second electrode on the first substrate, an auxiliary electrode provided on a surface facing the first substrate of the second substrate, and a plurality of pillars that are inclined to respective surfaces of the first substrate and the second substrate, and configured to electrically connect the auxiliary electrode to the second electrode.

According to an embodiment of the present technology, there is provided an electronic apparatus (2) including a display unit, the display unit including a first substrate and a second substrate opposed to each other, a display element having a first electrode and a second electrode on the first substrate, an auxiliary electrode provided on a surface facing the first substrate of the second substrate, and including a plurality of films stacked in a direction from the second substrate to the first substrate, and a plurality of pillars configured to electrically connect the auxiliary electrode to the second electrode.

In the display unit (2) and the electronic apparatus (2) each according to the above-described embodiment of the present technology, since the pillars are inclined to the respective surfaces of the first substrate and the second substrate, a distance (hereinafter, referred to as apparent length) occupied by each pillar in a perpendicular direction to each of the first and second substrates is shorter than actual length of the pillar. Specifically, variation in apparent length of the pillar is smaller than variation in actual length of the pillar.

According to an embodiment of the present technology, there is provided a display unit (3), including a first substrate and a second substrate opposed to each other, a display element having a first electrode and a second electrode on the first substrate, an auxiliary electrode provided on a surface facing the first substrate of the second substrate, a buffer film between the auxiliary electrode and the second substrate, and a plurality of pillars configured to electrically connect the auxiliary electrode to the second electrode.

According to an embodiment of the present technology, there is provided an electronic apparatus (3) a display unit, the display unit including a first substrate and a second substrate opposed to each other, a display element having a first electrode and a second electrode on the first substrate, an auxiliary electrode provided on a surface facing the first substrate of the second substrate, a buffer film between the auxiliary electrode and the second substrate, and a plurality of pillars configured to electrically connect the auxiliary electrode to the second electrode.

In the display unit (3) and the electronic apparatus (3) each according to the above-described embodiment of the present technology, since the buffer film is provided between the auxiliary electrode and the second substrate, when the auxiliary electrode is brought into contact with the second electrode of the display element via the pillar, shock is absorbed by the buffer film.

According to the display unit (1) and the electronic apparatus (1) of the above-described embodiment of the present technology, the auxiliary electrode is configured of the plurality of films being stacked. According to the display unit (2) and the electronic apparatus (2) of the above-described embodiment of the present technology, each pillar is inclined to respective surfaces of the first substrate and the second substrate. According to the display unit (3) and the electronic apparatus (3) of the above-described embodiment of the present technology, the buffer film is provided between the auxiliary electrode and the second substrate, and therefore when the auxiliary electrode is brought into contact with the second electrode of the display element via the pillars, it is possible to reduce shock to other components. Consequently, it is possible to reduce damage to other components due to pillar formation. It is to be noted that the effects described herein are not necessarily limitative, and any of other effects described in this disclosure may be shown.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 25 is a plan diagram illustrating a schematic configuration of a module including the display unit illustrated in FIG. 1 or the like.

DETAILED DESCRIPTION

Hereinafter, some embodiments of the present technology will be described in detail with reference to the accompanying drawings. It is to be noted that description is made in the following order.

1. First embodiment (display unit: an example where an auxiliary electrode is configured of a plurality of films).
2. Modification 1 (an example where Young's moduli or film densities of the plurality of films are different from one another).
3. Modification 2 (an example where thicknesses of the plurality of films are different from one another).
4. Modification 3 (an example where the plurality of films have openings).
5. Second embodiment (display unit: an example where each pillar is inclined to a substrate surface).
6. Modification 4 (an example where an end of each pillar is embedded in a conductive resin layer on a device substrate).
7. Modification 5 (an example where a display unit has pillars inclined to a substrate surface and an auxiliary electrode configured of a plurality of films).
8. Third embodiment (display unit: an example where a buffer layer is provided between a substrate and an auxiliary electrode).
9. Modification 6 (an example where a display unit has a buffer layer and pillars inclined to a substrate surface).
10. Modification 7 (an example where a display unit has a buffer layer and an auxiliary electrode configured of a plurality of films).
11. Modification 8 (an example where a display unit has a buffer layer, an auxiliary electrode configured of a plurality of films, and pillars inclined to a substrate surface).

<First Embodiment>
[Overall Configuration of Display Unit 1]

Figure 1:
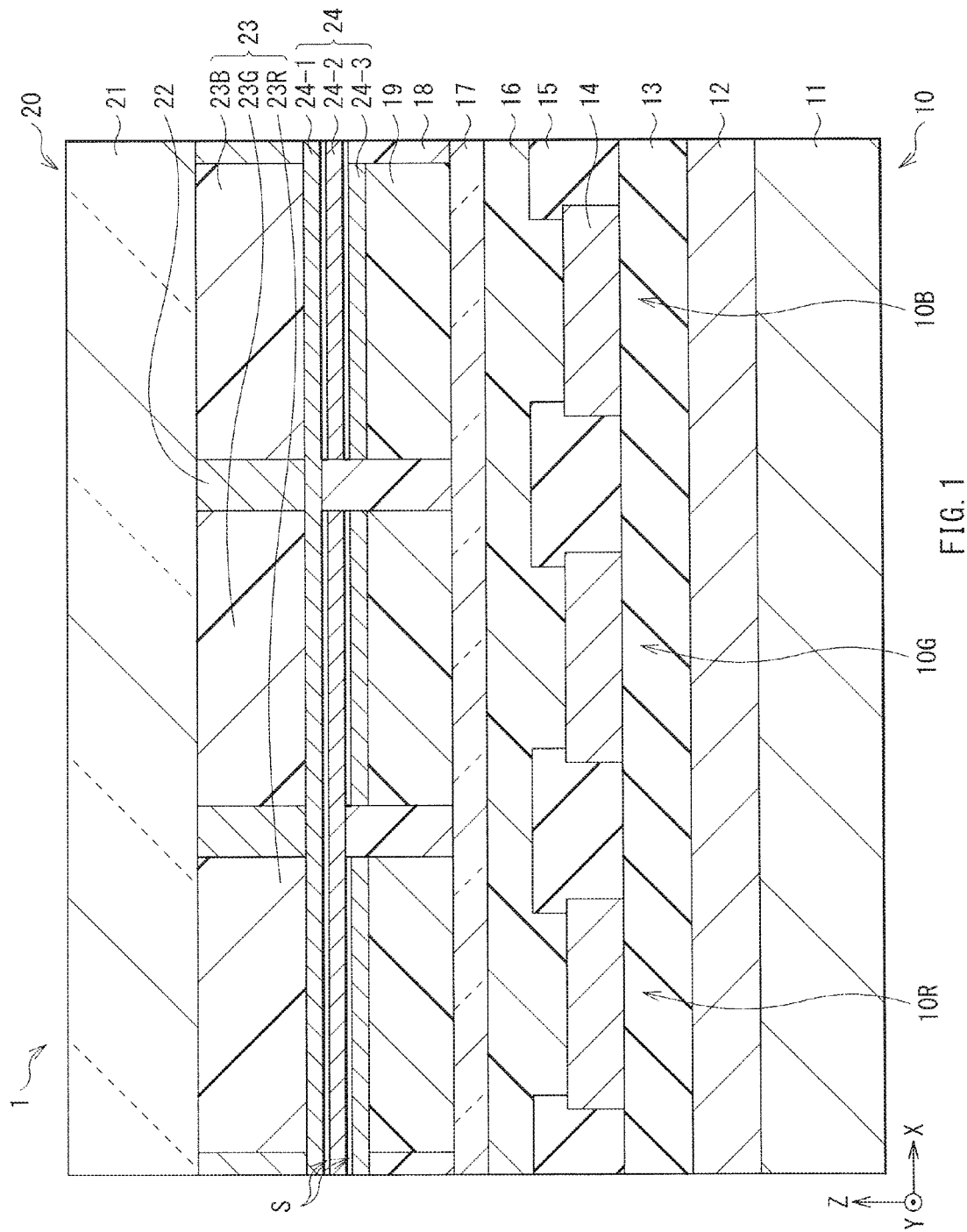
FIG. 1 is a section diagram illustrating a configuration of a display unit according to a first embodiment of the present technology.

FIG. 1 illustrates a main-part sectional configuration of an organic EL display unit (display unit 1) as a first embodiment of the present technology. The display unit 1 includes a device panel 10 and a sealing panel 20, and is a so-called top-emission display from which light is extracted through the sealing panel 20.

The device panel 10 includes a device substrate 11 (first substrate) on which an organic light emitting element 10R generating red light, an organic light emitting element 10G generating green light, and an organic light emitting element 10B generating blue light are provided. The organic light emitting elements 10R, 10G, and 10B (display elements) each include, for example, a first electrode 14, an organic layer 16, and a second electrode 17 in this order on the device substrate 11. A thin film transistor (TFT) layer 12 and a planarization layer 13 are provided between the organic light emitting elements 10R, 10G, and 10B and the device substrate 11. The organic light emitting elements 10R, 10G, and 10B are covered with a sealing layer 19 provided between the organic light emitting elements 10R, 10G, and 10B and the sealing panel 20. The sealing panel 20 includes a sealing substrate 21 (second substrate) opposed to the device substrate 11, and includes a black matrix 22, a color filter 23, an undepicted overcoat layer, and an auxiliary electrode 24 provided in this order on a surface facing the device substrate 11 of the sealing substrate 21.

In the display unit 1, pillars 18 are provided between the device panel 10 and the sealing panel 20, and the auxiliary electrode 24 of the sealing panel 20 is electrically connected to the second electrode 17 of the device panel 10 via the pillars 18.

Figure 2:
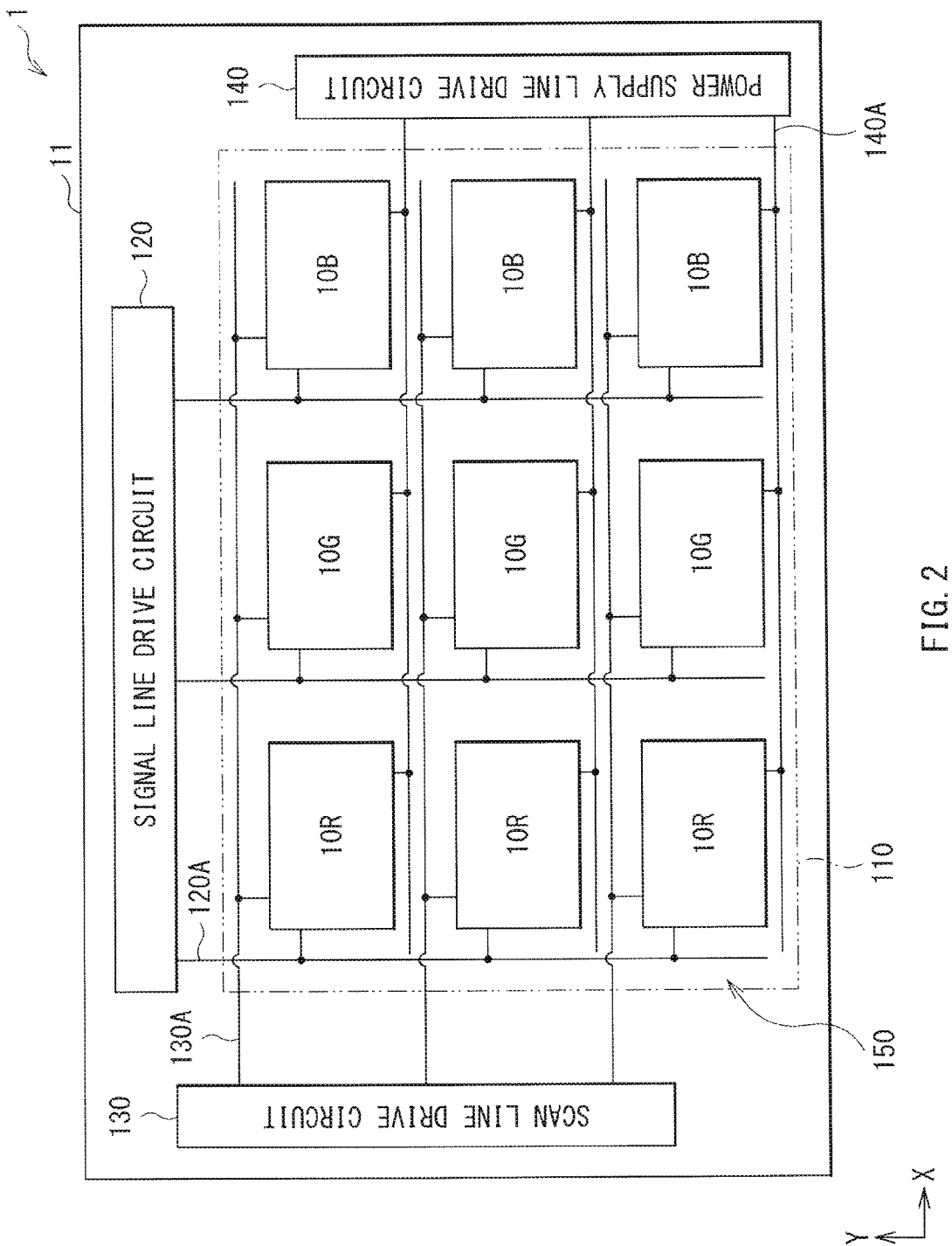
FIG. 2 is a diagram illustrating an overall configuration of the display unit illustrated in FIG. 1.

FIG. 2 illustrates an overall configuration of the display unit 1. The display unit 1 has a display region 110, in which the organic light emitting elements 10R, 10G, and 10B are two-dimensionally arranged in a matrix, in a central portion thereof. For example, a signal-line drive circuit 120 as a driver for image display, a scan-line drive circuit 130, and a power-supply-line drive circuit 140 may be provided in the periphery of the display region 110.

In the display region 110, a pixel drive circuit 150 for driving a plurality of organic light emitting elements 10R, 10G, and 10B is provided together with the organic light emitting elements 10R, 10G, and 10B. In the pixel drive circuit 150, a plurality of signal lines 120A (120A1, 120A2, ..., 120Am, ...) are disposed in a column direction (Y direction), and a plurality of scan lines 130A (130A1, ..., 130An, ...) and a plurality of power supply lines 140A (140A1, ..., 140An, ...) are disposed in a row direction (X direction). Each of the organic light emitting elements 10R, 10G, and 10B is provided at an intersection of each signal line 120A and each scan line 130A. The signal lines 120A are each connected at its two ends to the signal-line drive circuit 120. The scan lines 130A are each connected at its two ends to the scan-line drive circuit 130. The power supply line 140A are each connected at its two ends to the power-supply-line drive circuit 140.

The signal-line drive circuit 120 receives a signal voltage of an image signal corresponding to luminance information from an undepicted signal supply source, and supplies the signal voltage of the image signal to each of selected organic light emitting elements 10R, 10G, and 10B through each signal line 120A. The scan-line drive circuit 130 includes a shift register, which sequentially shifts (transfers) a start pulse in synchronization with a received clock pulse, and the like. In write of an image signal to each of the organic light emitting elements 10R, 10G, and 10B, the scan-line drive circuit 130 scans the organic light emitting elements 10R, 10G, and 10B in rows, and sequentially supplies a scan signal to each scan line 130A. Each signal line 120A receives the signal voltage from the signal-line drive circuit 120, and each scan line 130A receives the scan signal from the scan-line drive circuit 130.

The power-supply-line drive circuit 140 includes a shift register, which sequentially shifts (transfers) a start pulse in synchronization with a received clock pulse, and the like. In synchronization with the scan in rows by the scan-line drive circuit 130, the power-supply-line drive circuit 140 appropriately supplies one of a first electric potential and a second electric potential different from each other to two ends of each power supply line 140A. As a result, a transistor Tr1 described later is selected to be in a conductive state or in a nonconductive state.

Figure 3:
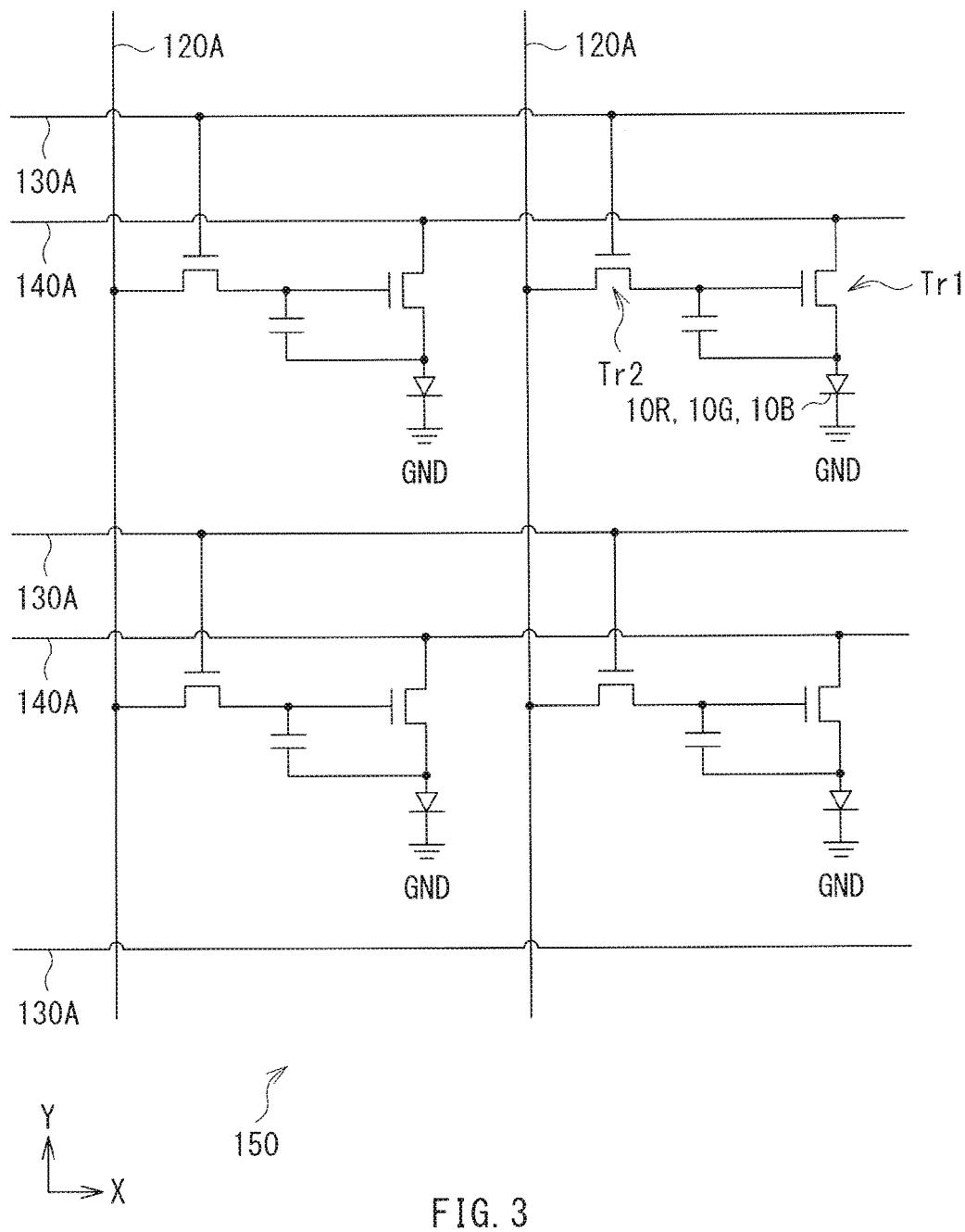
FIG. 3 is a diagram illustrating an example of a pixel drive circuit illustrated in FIG. 2.

FIG. 3 illustrates an exemplary configuration of the pixel drive circuit 150. The pixel drive circuit 150 is an active drive circuit including the transistor Tr1, a transistor Tr2, a capacitor (holding capacitor) Cs, and the organic light emitting elements 10R, 10G, and 10B. The organic light emitting elements 10R, 10G, and 10B are connected in series to the transistor Tr1 between the power supply line 140A and a common power supply line (GND). The transistor Tr1 and the transistor Tr2 may each have an inversely-staggered structure (so-called bottom gate type) or a staggered structure (top gate type).

For example, the transistor Tr2 may have a drain electrode connected to the signal line 120A so as to receive an image signal from the signal-line drive circuit 120. The gate electrode of the transistor Tr2 is connected to the scan line 130A so as to receive a scan signal from the scan-line drive circuit 130. Furthermore, the source electrode of the transistor Tr2 is connected to the gate electrode of the drive transistor Tr1.

For example, the transistor Tr1 may have a drain electrode that is connected to the power supply line 140A so as to be set to one of the first electric potential and the second electric potential supplied from the power-supply-line drive circuit 140. The source electrode of the transistor Tr1 is connected to the organic light emitting elements 10R, 10G, and 10B.

The holding capacitor Cs is formed between the gate electrode of the transistor Tr1 (the source electrode of the transistor Tr2) and the source electrode of the transistor Tr1.

[Main-Part Configuration of Display Unit 1]

A detailed configuration of each of the device panel 10 and the sealing panel 20 is now described with reference to FIG. 1 again.

For example, the device substrate 11 may be formed of glass, a plastic material, or the like capable of blocking permeation of water (steam) and oxygen. The device substrate 11 is a support having one main surface on which the organic light emitting elements 10R, 10G, and 10B are arranged. Examples of a constitutional material of the device substrate 11 include a glass substrate including high-strain-point glass, soda glass ($Na_2O.CaO.SiO_2$), borosilicate glass ($Na_2O.B_2O_3.SiO_2$), forsterite ($2MgO.SiO_2$), lead glass ($Na_2O.PbO.SiO_2$) or the like, a quartz substrate, and a silicon substrate. An insulating film may be provided on a surface of such a glass substrate, quartz substrate, or silicon substrate to configure the device substrate 11. A metal foil, a resin film, a resin sheet, etc., may be used for the device substrate 11. Examples of a material of the resin include organic polymer such as polymethylmethacrylate (PMMA), polyvinyl alcohol (PVA), polyvinyl phenol (PVP), polyether sulfone (PES), polyimide, polycarbonate, polyethylene terephthalate (PET), polyethylene naphthalate (PEN), and the like. In the top emission display, since light is extracted through the sealing substrate 21, the device substrate 11 may be formed of either of a transmissible material or a non-transmissible material. A material equal to or different from the material for the device substrate 11 may be used for the sealing substrate 21. The device substrate 11 may be configured of a flexible material.

For example, the TFT layer 12 may have the transistors Tr1 and Tr2 that each function as an active element for each of the organic light emitting elements 10R, 10G, and 10B. For example, the transistors Tr1 and Tr2 may each include a gate electrode, a gate insulating film, a source electrode, a drain electrode, and a semiconductor layer. For example, the source electrode and the drain electrode of each of the transistors Tr1 and Tr2 may each be electrically connected to a predetermined interconnection through an undepicted interlayer insulating film configured of silicon oxide, etc. For example, an interconnection connected to the transistor Tr2 may be connected to the signal line 120A, and an interconnection connected to the transistor Tr1 may be connected to (the first electrode 14 of) each of the organic light emitting elements 10R, 10G, and 10B through each of undepicted connection holes in the planarization layer 13.

The planarization layer 13 is provided between the TFT layer 12 and the organic light emitting elements 10R, 10G, and 10B in order to planarize a surface of the device substrate 11 on which the TFT layer 12 is provided. Since the planarization layer 13 is to have fine connection holes (not shown) for connecting interconnections in the TFT layer 12 to the first electrode 14, the planarization layer 13 is preferably configured of a material having excellent pattern accuracy. When a material having low water absorption is used for the planarization layer 13, the organic light emitting elements 10R, 10G, and 10B are allowed to be prevented from being deteriorated by water. For example, an organic material such as polyimide may be used for the planarization layer 13. Adding a function of shielding blue or UV light to the planarization layer 13 makes it possible to suppress deterioration of transistors in the TFT layer 12.

A dividing wall 15 is disposed between adjacent two of the organic light emitting elements 10R, 10G, and 10B. For example, stripe arrangement, diagonal arrangement, delta arrangement, rectangle arrangement, or the like may be adopted as arrangement of the organic light emitting elements 10R, 10G, and 10B without limitation.

The first electrodes 14 of the organic light emitting elements 10R, 10G, and 10B are separately disposed on the planarization layer 13. For example, the first electrode 14 has both functions of an anode electrode and a reflective layer, and is desirably configured of a material having high reflectivity and a high hole injection property. Examples of such a first electrode 14 may include a single metal element of chromium (Cr), gold (Au), platinum (Pt), nickel (Ni), copper (Cu), molybdenum (Mo), tungsten (W), titanium (Ti), tantalum (Ta), aluminum (Al), iron (Fe), silver (Ag), and the like or an alloy containing these metals having a thickness in a stacking direction (hereinafter, simply referred to as thickness) of 0.1 μm to 1 μm both inclusive. The first electrode 14 may be a stack of such metal films. Ag—Pd—Cu alloy including Ag, 0.3 wt % to 1 wt % both inclusive of palladium (Pd), and 0.3 wt % to 1 wt % both inclusive of copper, or Al—Nd (neodymium) alloy may be used for the first electrode 14. Although a material having a high work function is preferably used for the first electrode 14, a metal having a low work function such as aluminum, aluminum alloy, and the like may also be used for the first electrode 14 by selecting an appropriate organic layer 16 (in particular, a hole injection layer described later).

The first electrode 14 is covered with the dividing wall 15 over an area from its surface (a surface facing the second electrode 17) to its side face. An opening of the dividing wall 15 acts as a light emitting region of each of the organic light emitting elements 10R, 10G, and 10B. The dividing wall 15 has a role of controlling the light emitting region to be into an accurately desired shape, and a role of securing isolation between the first electrode 14 and the second electrode 17. For example, an organic material such as polyimide, etc., or an inorganic material such as silicon oxide ($SiO_2$), silicon nitride (SiNx), silicon oxynitride (SiON), etc. may be used for the dividing wall 15. The dividing wall 15 has a thickness of, for example, 50 nm to 2500 nm both inclusive.

For example, the organic layer 16 is provided in common to all the organic light emitting elements 10R, 10G, and 10B, and includes a hole injection layer, a hole transport layer, a light emitting layer, an electron transport layer, and an electron injection layer, all of which are not shown, in order of closeness to the first electrode 14. The organic layer 16 may be configured of the hole transport layer, the light emitting layer, and the electron transport layer. In this case, the light emitting layer may also serve as the electron transport layer. The organic layer 16 may be configured of a plurality of such consecutive laminated structures (so-called tandem units) being stacked. For example, the tandem unit may be provided for each of colors of red, green, blue, and white, and such tandem units may be stacked to configure the organic layer 16.

The hole injection layer improves hole injection efficiency, and acts as a buffer layer for preventing leakage. The hole injection layer may have a thickness of, for example, 1 nm to 300 nm both inclusive, and is configured of a hexaazatriphenylene derivative shown by Chemical Formula 1 or 2.

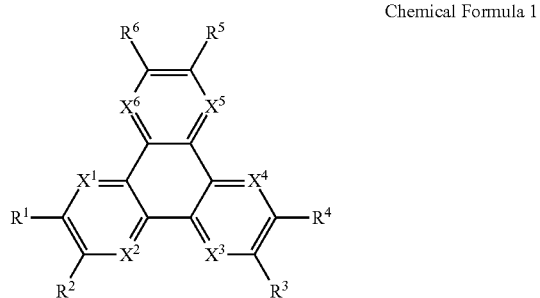

Chemical Formula 1

(in Chemical Formula 1, R1 to R6 are each independently a substituent selected from hydrogen, halogen, a hydroxyl group, an amino group, an arylamino group, a substituted or non-substituted carbonyl group having 20 or less carbons, a substituted or non-substituted carbonyl ester group having 20 or less carbons, a substituted or non-substituted alkyl group having 20 or less carbons, a substituted or non-substituted alkenyl group having 20 or less carbons, a substituted or non-substituted alkoxyl group having 20 or less carbons, a substituted or non-substituted aryl group having 30 or less carbons, a substituted or non-substituted heterocyclic group having 30 or less carbons, a nitrile group, a cyano group, a nitro group, and a silyl group, and adjacent Rm (m=1 to 6) may be bonded to each other through a cyclic structure. X1 to X6 are each independently a carbon or nitrogen atom.)

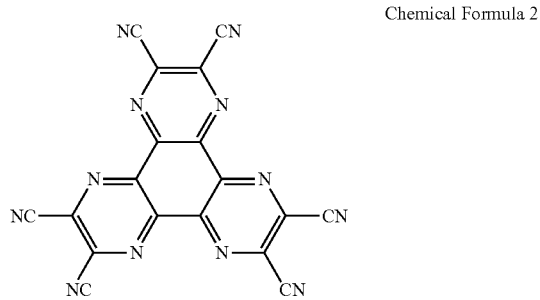

Chemical Formula 2

The hole transport layer improves hole transport efficiency into the light emitting layer. The hole transport layer may have a thickness of, for example, about 40 nm, and is configured of 4,4',4''-tris(3-methylphenylphenylamino)triphenylamine (m-MTDATA) or α-naphthyl phenyl diamine (αNPD).

The light emitting layer may be, for example, a light emitting layer for white light emission, and may have a stack of, for example, a red light emitting layer, a green light emitting layer, and a blue light emitting layer, all of which are not shown, between the first electrode 14 and the second electrode 17. The red light emitting layer, the green light emitting layer, and the blue light emitting layer are designed such that part of holes injected from the first electrode 14 through the hole injection layer and the hole transport layer and part of electrons injected from the second electrode 17 through the electron injection layer and the electron transport layer are recombined in response to an applied electric field, so that red light, green light, and blue light are generated, respectively.

For example, the red light emitting layer may contain one or more of a red light emitting material, a hole transport material, an electron transport material, and an electron/hole transport material. The red light emitting material may be a fluorescent or phosphorescent material. For example, the red light emitting layer may have a thickness of about 5 nm, and may be configured of 4,4'-bis(2,2-diphenylvinyl)biphenyl (DPVBi) mixed with 30 wt % of 2,6-bis[(4'-methoxydiphenylamino)styryl]-1,5-dicyanonaphthalene (BSN).

For example, the green light emitting layer may contain one or more of a green light emitting material, a hole transport material, an electron transport material, and an electron/hole transport material. The green light emitting material may be a fluorescent or phosphorescent material. For example, the green light emitting layer may have a thickness of about 10 nm, and may be configured of DPVBi mixed with 5 wt % of coumarin 6.

For example, the blue light emitting layer may contain one or more of a blue light emitting material, a hole transport material, an electron transport material, and an electron/hole transport material. The blue light emitting material may be a fluorescent or phosphorescent material. For example, the blue light emitting layer may have a thickness of about 30 nm, and may be configured of DPVBi mixed with 2.5 wt % of 4,4'-bis[2-{4-(N,N-diphenylamino)phenyl}vinyl]biphenyl (DPAVBi).

The electron transport layer improves electron transport efficiency into the light emitting layer, and, for example, may be configured of 8-hydroxyquinoline aluminium (Alq3) having a thickness of about 20 nm. The electron injection layer improves electron injection efficiency into the light emitting layer, and, for example, may be configured of LiF or $Li_2O$ having a thickness of about 0.3 nm.

An undepicted high resistance layer may be provided between the organic layer 16 and the second electrode 17. The high resistance layer prevents occurrence of short-circuit between the first electrode 14 and the second electrode 17, and, for example, may be provided in common to all the organic EL devices 10R, 10G, and 10B. For example, the high resistance layer may be configured of niobium oxide ($Nb_2O_5$), titanium oxide ($TiO_2$), molybdenum oxide ($MoO_2$, $MoO_3$), tantalum oxide ($Ta_2O_5$), hafnium oxide (HfO), magnesium oxide (MgO), $InGaZnO_x$ (IGZO), a mixture of niobium oxide and titanium oxide, a mixture of titanium oxide and zinc oxide (ZnO), a mixture of silicon oxide ($SiO_2$) and tin oxide ($SnO_2$), a mixture of zinc oxide and one or more of magnesium oxide, silicon oxide, and aluminum oxide ($Al_2O_3$), or the like.

The second electrode 17 pairs with the first electrode 14 with the organic layer 16 in between, and is, for example, provided on the electron injection layer in common to all the organic EL devices 10R, 10G, and 10B. For example, the second electrode 17 may have both functions of a cathode electrode and a light-transmissive layer, and is desirably configured of a material having high conductivity and high light transmittance. Consequently, for example, the second electrode 17 may be configured of an alloy of aluminum (Al), magnesium (Mg), silver (Ag), calcium (Ca), or sodium (Na). In particular, an alloy of magnesium and silver (Mg—Ag alloy) preferably has conductivity of a thin film and low light absorption. A ratio of magnesium to silver of the Mg—Ag alloy is desirably, but not limited to, within a range of Mg:Ag=20:1 to 1:1 in thickness ratio. An alloy of aluminum (Al) and lithium (Li) (Al—Li alloy), indium tin oxide (ITO), zinc oxide (ZnO), alumina-doped zinc oxide (AZO), gallium-doped zinc oxide (GZO), indium zinc oxide (IZO), indium titanium oxide (ITiO), indium tungsten oxide (IWO), or the like may be used for the material for the second electrode 17. As described in detail later, since the display unit 1 has the auxiliary electrode 24, it is possible to reduce the thickness of the second electrode 17 that therefore has a thickness of about 10 nm to about 500 nm both inclusive, for example. The second electrode 17 and the high resistance layer each have a function of preventing water from entering the organic layer 16.

The sealing layer 19 between the device panel 10 and the sealing panel 20 prevents water from entering the organic layer 16 and increases mechanical strength of the display unit 1, and is provided so as to cover the second electrode 17. The sealing layer 19 has a light transmittance of about 80% and a thickness of 3 μm to 20 μm both inclusive, preferably 5 μm to 15 μm both inclusive. When the thickness of the sealing layer 19 is larger than 20 μm, a distance between the organic light emitting elements 10R, 10G, and 10B and the color filter 23 increases, and luminance in a direction oblique to the device substrate 11 may be low compared with luminance in a front direction. In addition, color mixing may occur and chromaticity may be lowered, leading to narrowing of viewing angle. On the other hand, when the thickness of the sealing layer 19 is less than 3 μm, and if a foreign substance is caught while the device panel 10 is bonded to the sealing panel 20, the foreign substance easily comes into contact with the organic light emitting elements 10R, 10G, and 10B. The foreign substance may cause pressure on the organic light emitting elements 10R, 10G, and 10B, leading to occurrence of a dark dot such as a dead pixel.

The black matrix 22 of the sealing panel 20 may be patterned, for example, in a matrix in correspondence to arrangement of the organic light emitting elements 10R, 10G, and 10B in the display region 110. For example, the black matrix 22 may be configured of carbon black. A material having light shielding performance and conductivity, such as chromium, graphite, and the like may be used for the black matrix 22. Alternatively, the black matrix 22 may be configured of a thin film filter using thin-film interference. For example, the thin-film filter may attenuate light through thin-film interference caused by one or more layers of thin films of metal, metal nitride, metal oxide, or the like being stacked. Examples of such a thin-film filter may include thin films of silicon nitride (SiN) 65 nm thick, amorphous silicon (a-Si) 20 nm thick, and molybdenum (Mo) 50 nm or more thick stacked in this order from closeness to the sealing substrate 21, or thin films of molybdenum oxide ($MoO_x$) 45 nm thick, molybdenum (Mo) 10 nm thick, molybdenum oxide 40 nm thick, and molybdenum (Mo) 50 nm or more thick stacked in this order from closeness to the sealing substrate 21.

For example, the color filter 23 may include a red filter 23R, a green filter 23G, and a blue filter 23B that are arranged in correspondence to a pattern of the organic light emitting elements 10R, 10G, and 10B. The color filter 23 may be provided at a position corresponding to a position of the black matrix 22. For example, the red filter 23R, the green filter 23G, and the blue filter 23B may each be configured of a resin in which a pigment or a dye is mixed. Through appropriate selection of a type of the pigment or the dye, the red filter 23R, the green filter 23G, and the blue filter 23B are adjusted to increase light transmittance of respective wavelength ranges of red, green, and blue. The color filter 23 has a low light transmittance in any of wavelength ranges other than the target wavelength ranges of red, green, and blue. The color filter 23 may have a thickness of, for example, 1 μm to 4 μm both inclusive. While the color filter 23 may be provided on either surface (a surface facing the device substrate 11 or a surface on a side opposite thereto), the color filter 23 is preferably provided on the surface facing the device substrate 11. This is because the color filter 23 is allowed to be covered with the sealing layer 19 and the auxiliary electrode 24 while being not exposed to a surface. In addition, this results in a small distance between the organic layer 16 and the color filter 23, thereby it is possible to avoid occurrence of color mixing due to light that is emitted from the organic layer 16 and enters an adjacent another color filter.

A surface (surface facing the device substrate 11) of the color filter 23 is covered with an undepicted overcoat layer. The overcoat layer includes a coating agent that improves flatness of the surface of the color filter 23 and protects the surface, and, for example, may be configured of an organic material such as resin, or an inorganic material such as SiO, SiN, ITO, or the like.

The auxiliary electrode 24 suppresses occurrence of so-called IR drop. In the top-emission display, a light-transmissive conductive film is used for the second electrode. Since the light-transmissive conductive film has a high resistivity, interconnection resistance increases at high rate with an increase in distance from a feeding point to each organic light emitting element. In addition, the second electrode preferably has a small thickness, resulting in a further high resistance of the second electrode. Hence, if the distance between each organic light emitting element and the feeding point increases, effective voltage applied to the organic light emitting element is extremely lowered, and thus luminance is also extremely lowered. It is possible to suppress occurrence of such IR drop by providing the auxiliary electrode 24 that serves as a current bypass between the second electrode 17 and a feeding point of the second electrode 17. The auxiliary electrode 24 electrically connects the second electrode 17 of the organic light emitting elements 10R, 10G, and 10B to the common power supply line (GND).

In the first embodiment, the auxiliary electrode 24 includes a plurality of films (films 24-1, 24-2, and 24-3) stacked in a direction from the sealing substrate 21 to the device substrate 11. As described in detail later, this makes it possible to reduce shock when the auxiliary electrode 24 is brought into contact with the second electrode 17 of the organic light emitting elements 10R, 10G, and 10B via the pillars 18.

For example, the films 24-1, 24-2, and 24-3 are each provided over the entire area of the display region 110 of the sealing substrate 21, and are disposed in this order from a position close to the sealing substrate 21. Such films 24-1, 24-2, and 24-3 are each preferably configured of a material having a high light transmittance and a low electric resistivity, and are each specifically configured of a material similar to that of the second electrode 17. A conductive material 10 μm or less in thickness may be provided on a resin film including polyethylene terephthalate (PET) or the like having a thickness of 1 μm to 100 μm both inclusive to configure the films 24-1, 24-2, and 24-3. Examples of the conductive material include carbon nanotube, ITO, nano silver, and the like. Aluminum, aluminum alloy, or any other metal may be provided on the resin film. Each of such materials preferably has a small thickness. For example, the films 24-1, 24-2, and 24-3 may be configured of the same material, and may have the same thickness. The auxiliary electrode 24 is formed by stacking the separately produced films 24-1, 24-2, and 24-3.

For example, each of the films 24-1, 24-2, and 24-3 may have a sheet resistance of 1 Ω/sq to 1000 Ω/sq both inclusive.

The auxiliary electrode 24 preferably has a space S between the films, i.e., between the films 24-1 and 24-2 and between the films 24-2 and 24-3. For example, the space S may be filled with a noble gas, dry nitrogen ($N_2$), dry air, or a moisture absorbent. The space S may be a vacuum space. The films 24-1, 24-2, and 24-3 may be in contact with each other.

Figure 4:
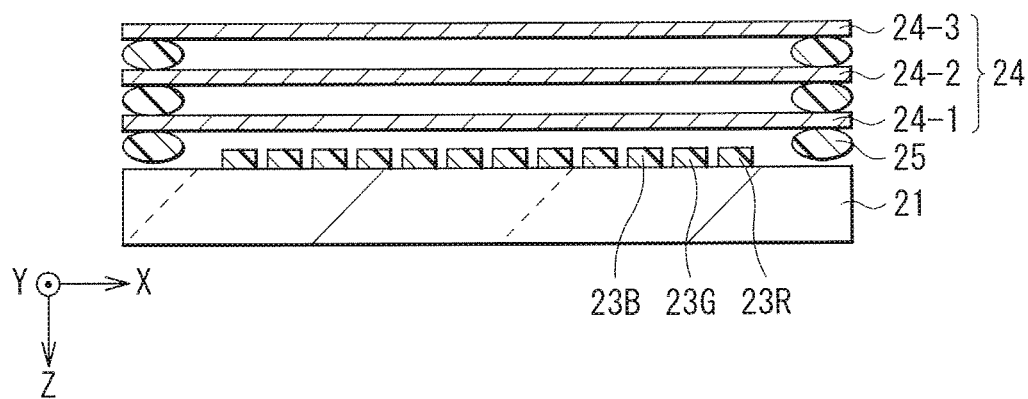
FIG. 4 is a section diagram illustrating a configuration of an auxiliary electrode illustrated in FIG. 1.

FIG. 4 illustrates a sectional configuration of the auxiliary electrode 24 as a whole. As illustrated in FIG. 4, in the auxiliary electrode 24, a seal material 25 is provided on the periphery of each of the films 24-1, 24-2, and 24-3 that are thereby fixed to each other. The seal material 25 is also provided between the film 24-1 and the sealing substrate 21, so that the auxiliary electrode 24 is fixed to the sealing substrate 21. Photo-curable resin, thermosetting resin, or the like is allowed to be used for the seal material 25. Specifically, epoxy resin is allowed to be used. In the case where the films 24-1, 24-2, and 24-3 are configured of the conductive material and the resin film as described above, it is preferred that a film of the conductive material is formed in a central portion of the resin film, and the seal material 25 is brought in contact with the resin film in the periphery of the resin film. Furthermore, the resin film and the seal material are preferably configured of the same material. This allows the resin film to have a composition and a structure similar to those of the seal material. Specifically, this allows a difference in each of an interatomic distance, a thermal expansion coefficient, and a surface state (hydrophilicity or hydrophobicity) to be small, so that the resin film and the seal material easily come into tight contact with each other. Consequently, it is possible to reduce entering of water from outside.

The pillars 18 between the auxiliary electrode 24 and the second electrode 17 each act as a feeding point to the second electrode 17, and electrically connect the second electrode 17 to the auxiliary electrode 24. For example, each of the pillars 18 may have a columnar shape, and has one end in contact with the auxiliary electrode 24 and the other end in contact with the second electrode 17. Although all the pillars 18 are preferably in contact with each of the second electrode 17 and the auxiliary electrode 24, there may exist a pillar 18 that is in contact with only one of the second electrode 17 and the auxiliary electrode 24.

For example, the pillar 18 may have a length (a Z direction in FIG. 1) of 3 μm to 20 μm both inclusive. It is possible to define a distance between the device panel 10 and the sealing panel 20 by the length of the pillar 18. One end of the pillar 18 may be in contact with only one of the films 24-1, 24-2, and 24-3 of the auxiliary electrode 24. Part or all of the pillars 18, each of which has one end in contact with the auxiliary electrode 24, may be in contact with the film 24-3, may be in contact with the film 24-2 through the film 24-3, or may be in contact with the film 24-1 through the films 24-2 and 24-3. Specifically, the pillar 18 in contact with the film 24-1 or 24-2 penetrates through the films/film (the films 24-2 and 24-3 or the film 24-3) at a position closer to the device substrate 11 than the film 24-1 or 24-2.

Elastic and deformable pillars 18 are preferably used to securely connect the second electrode 17 of the device panel 10 to the auxiliary electrode 24 of the sealing panel 20. If formed pillars 18 have lengths different from one another, and when the sealing panel 20 is bonded to the device panel 10, the pillars 18 come into contact with the second electrode 17 of the device panel 10 in decreasing order of length. The elastic and deformable pillars 18 are allowed to absorb such variation in length, and a relatively short pillar 18 is also allowed to be securely brought into contact with the second electrode 17. Furthermore, it is possible to absorb pressure on a relatively long pillar 18, and prevent the pillar 18 from being damaged by the pressure. It is also possible to adjust the distance between the device panel 10 and the sealing panel 20 not only by the pillars 18 but also by thickness of the color filter 23 between the black matrix 22 and the auxiliary electrode 24. The distance may be adjusted by overlapping the ends of adjacent two of the red filter 23R, the green filter 23G, and the blue filter 23B.

Each pillar 18 may have any shape, for example, a tapered shape (not shown). The pillar 18 is configured of a conductive material, specifically a material including a resin material, such as acrylic resin, epoxy resin, polyimide resin, or the like, in which conductive fine particles are mixed. The pillar 18 may be formed by attaching conductive particles into a film shape on the resin material. Alternatively, a conductive film may be provided on a surface of a resin material formed in a columnar shape to configure the pillar 18.

Figure 5A:
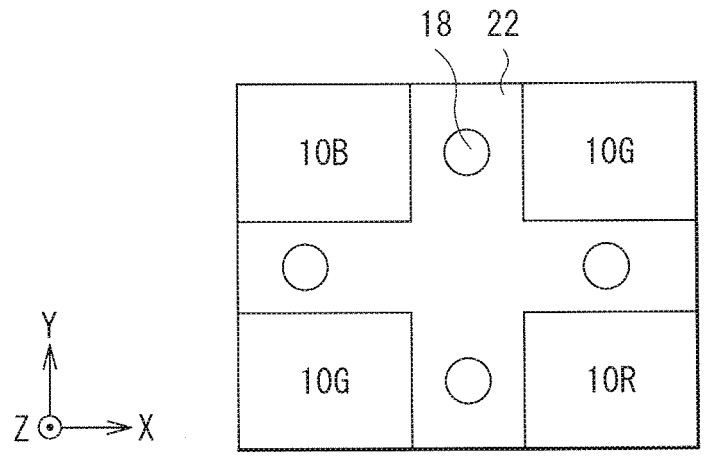
FIG. 5A is a plan diagram illustrating an exemplary layout of pillars illustrated in FIG. 1.
Figure 5B:
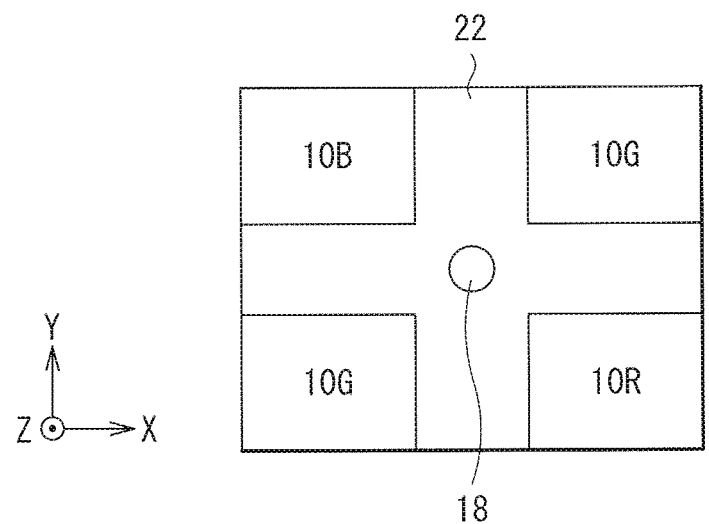
FIG. 5B is a plan diagram illustrating another exemplary layout of the pillars illustrated in FIG. 1.

As illustrated in FIG. 5A, each pillar 18 is disposed in a region (nonluminous region) between adjacent two of the organic light emitting elements 10R, 10G, and 10B while being opposed to the black matrix 22. In other words, the pillar 18 is provided between the second electrode 17 extending onto the dividing wall 15 and the auxiliary electrode 24. The pillar 18 may be provided for each of the organic light emitting elements 10R, 10G, and 10B (FIG. 5A), or may be provided for each pixel (one for sub-pixels of four colors) as illustrated in FIG. 5B.

[Method of Manufacturing Display Unit 1]

Figure 6A:
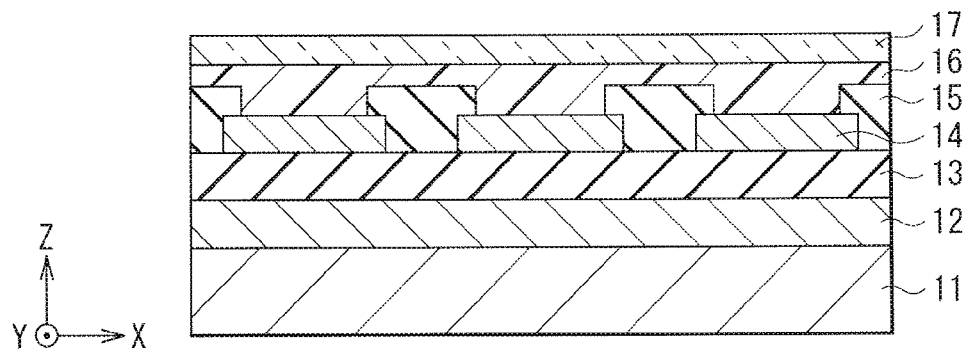
FIG. 6A is a section diagram illustrating a step of manufacturing a device panel of the display unit illustrated in FIG. 1.

For example, the display unit 1 may be manufactured in such a manner that the device panel 10 and the sealing panel 20 are separately formed and then bonded to each other. A formation step of the device panel 10 (FIGS. 6A and 6B), a formation step of the sealing panel 20 (FIG. 7), and a bonding step of the device panel 10 and the sealing panel 20 (FIGS. 8A and 8B) are now described in order.

[Method of Manufacturing Device Panel 10]

First, the TFT layer 12 and the planarization layer 13 are formed in this order on the device substrate 11. For example, the planarization layer 13 may be formed by a chemical vapor deposition (CVD) process, a coating process, a sputtering process, various printing processes, and the like. Connection holes are provided in the planarization layer 13.

Subsequently, a conductive film is formed on the planarization layer 13 by, for example, a sputter process, and then the conductive film is patterned by a photolithography process to form the first electrode 14. Subsequently, for example, a silicon nitride film is formed by, for example, a plasma CVD process on the first electrode 14 and the planarization layer 13, and then openings are formed in the silicon nitride film to form the dividing walls 15.

Subsequently, the organic layer 16 including the light emitting layer and the second electrode 17 are formed on the entire area of the display region 110 (FIG. 2) on the device substrate 11 by a physical vapor deposition (PVD) process, for example, a vacuum evaporation process, or the like. The organic layer 16 and the second electrode 17 may be formed by a printing process such as a screen printing process and an inkjet printing process, a laser transfer process, a coating process, or the like. The laser transfer process is a process where a stacked structure of a laser absorption layer and the organic layer 16 formed on a transfer substrate is irradiated with laser, so that the organic layer 16 is transferred onto the device substrate 11.

Figure 6B:
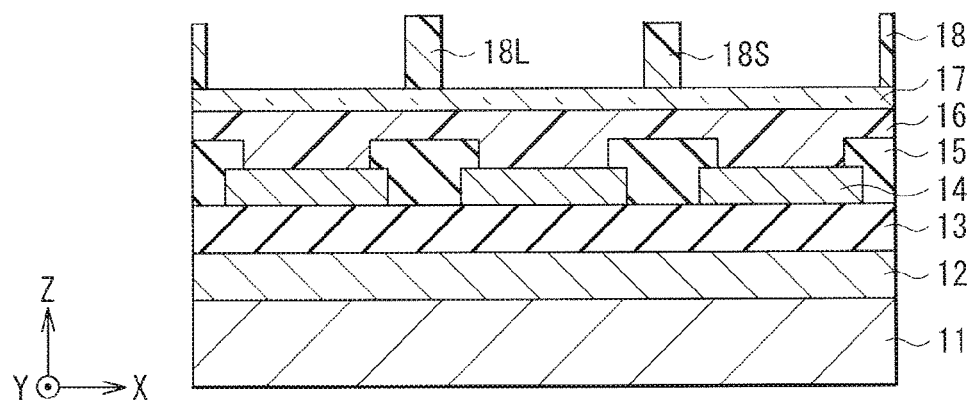
FIG. 6B is a section diagram illustrating a step following the step of FIG. 6A.

After the second electrode 17 is formed, the pillars 18 are formed while being electrically connected to the second electrode 17 (FIG. 6B). The pillars 18 are formed diverting a technique for a photo spacer used in a liquid crystal display, and the like. Specifically, first, for example, acrylic resin or the like is applied on the second electrode 17, and then the applied resin is molded into a desired shape using a photolithography process. Subsequently, an ITO film is formed by, for example, a sputter process on the entire surface of the second electrode 17 including a top of the molded resin, and thereby the pillars 18 are formed.

[Method of Manufacturing Sealing Panel 20]

Figure 7:
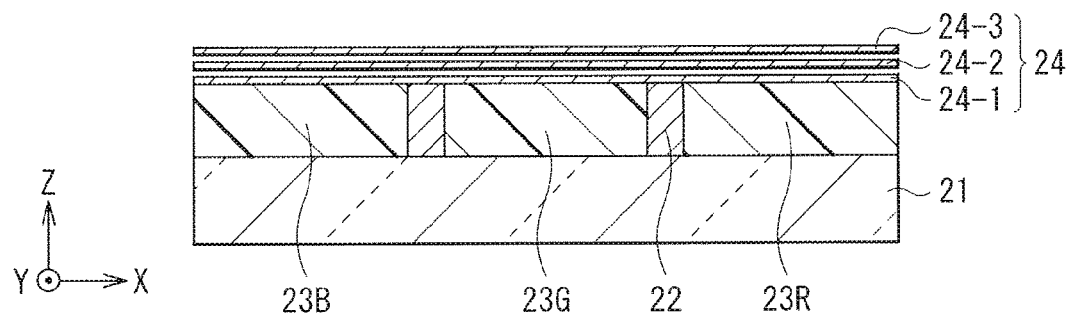
FIG. 7 is a section diagram illustrating a step of manufacturing a sealing panel of the display unit illustrated in FIG. 1.
Figure 9A:
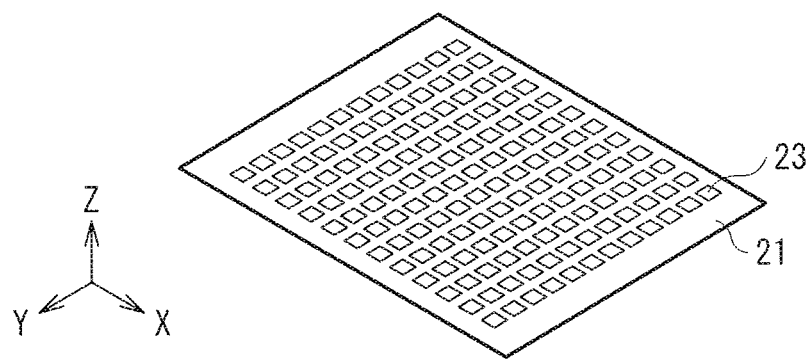
FIG. 9A is a perspective diagram illustrating a step of manufacturing the auxiliary electrode illustrated in FIG. 7.
Figure 9B:
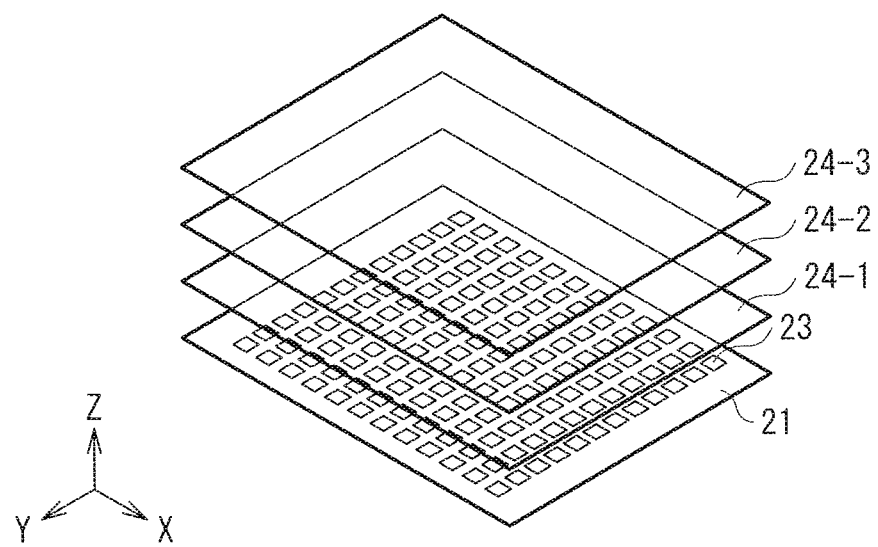
FIG. 9B is a perspective diagram illustrating a step following the step of FIG. 9A.

For example, the sealing panel 20 of the display unit 1 may be formed as follows (FIG. 7). First, a film of a constitutional material of the black matrix 22 is formed on the entire surface of the sealing substrate 21, and then the film is patterned in a matrix using, for example, a photolithography process, thereby a plurality of openings are formed in correspondence to arrangement of the organic light emitting elements 10R, 10G, and 10B. Subsequently, the red filter 23R, the green filter 23G, and the blue filter 23B are sequentially patterned to form the color filter 23 on the sealing substrate 21 having the black matrix 22 thereon. Subsequently, an undepicted overcoat layer is formed on the entire surface of the sealing substrate 21, and then the auxiliary electrode 24 is formed on the overcoat layer. For example, the auxiliary electrode 24 may be formed as follows. First, a conductive material film having a thickness of 0.01 μm to 5 μm both inclusive is formed on a resin film by, for example, a sputter process or an evaporation process, so that the films 24-1, 24-2, and 24-3 are formed. Subsequently, as illustrated in FIGS. 9A and 9B, the films 24-1, 24-2, and 24-3 are stacked while the seal material 25 (FIG. 4) is interposed between each two of them, thereby the auxiliary electrode 24 is formed. The sealing panel 20 is completed through the above steps.

[Bonding Step of Device Panel 10 and Sealing Panel 20]

Figure 8A:
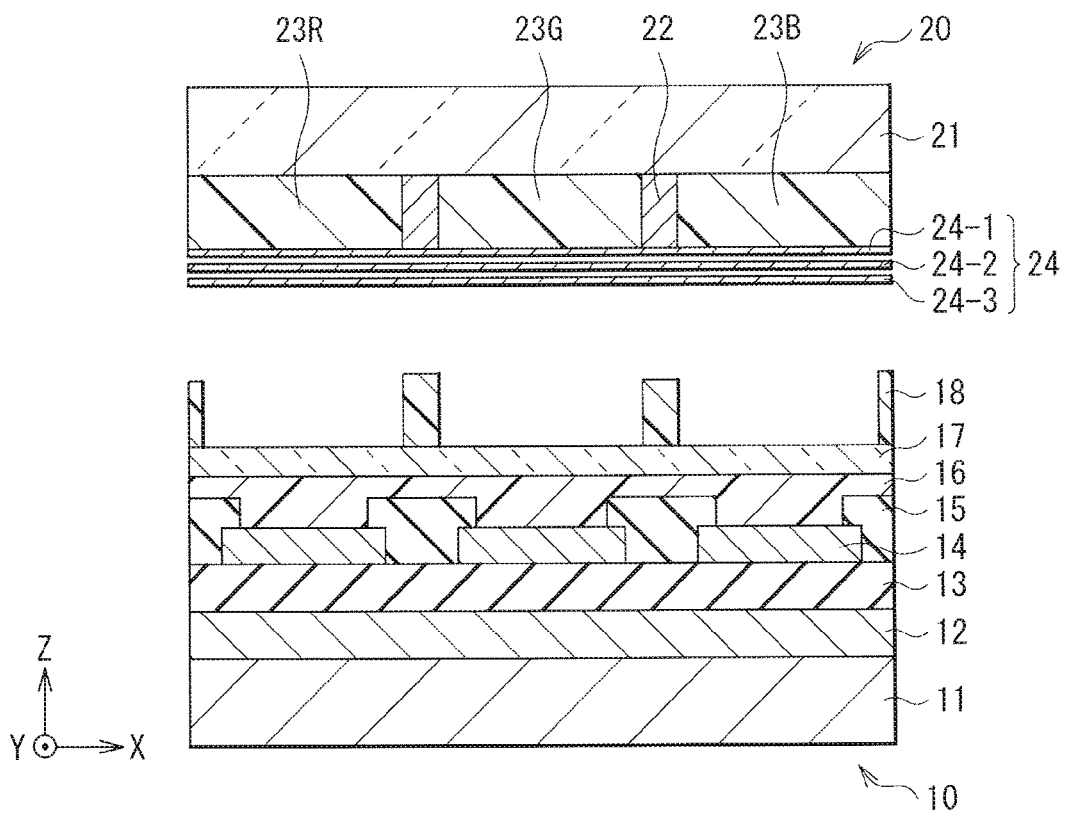
FIG. 8A is a section diagram illustrating a bonding step of the device panel illustrated in FIG. 6B to the sealing panel illustrated in FIG. 7.
Figure 8B:
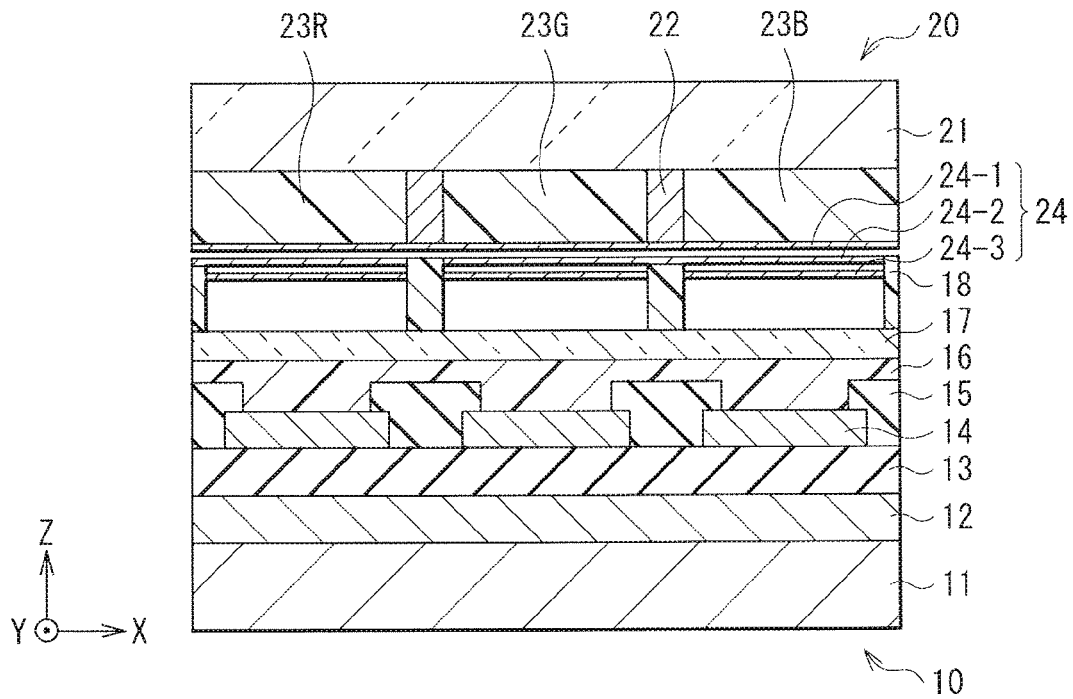
FIG. 8B is a section diagram illustrating a step following the step of FIG. 8A.

The device panel 10 and the sealing panel 20 formed as described above are bonded to each other with a sealing layer 19 in between by a one drop fill (ODF) process, for example, (FIGS. 8A and 8B). Specifically, a pair of an upper plate and a lower plate (not shown) are prepared in a vacuum chamber, and the sealing panel 20 is fixed to a surface facing the lower plate of the upper plate, while the device panel 10 is fixed to a surface facing the upper plate of the lower plate. Subsequently, a resin for forming the sealing layer 19 is dropped onto the device panel 10. Subsequently, the device panel 10 is bonded to the sealing panel 20 in the vacuum chamber, and then the inside of the vacuum chamber is adjusted into a nitrogen ($N_2$) atmosphere, and the device panel 10 is pressed to the sealing panel 20. Consequently, the pillars 18 come into contact with the films 24-1, 24-2, and 24-3 of the auxiliary electrode 24. Subsequently, the resin is cured in this state to form the sealing layer 19. This is the end of fabrication of the display unit 1 illustrated in FIG. 1.

[Operation of Display Unit 1]

In the display unit 1, when a drive current corresponding to an image signal of each color is applied to each of the organic light emitting elements 10R, 10G, and 10B, electrons and holes are injected into the organic layer 16 through the first electrode 14 and the second electrode 17. Such electrons and holes are recombined to each other in the light emitting layer included in the organic layer 16, and light emission occurs. Such emitted light is transmitted by the second electrode 17, the color filter 23, and the sealing substrate 21, and is then extracted to the outside. In this way, the display unit 1 may perform full-color image display of R, G, and B, for example. During such image display operation, an electric potential corresponding to an image signal is applied to one end of the capacitor Cs, and thereby charge corresponding to the image signal is accumulated in the capacitor Cs.

[Functions and Effects of Display Unit 1]

In the display unit 1, the auxiliary electrode 24 is configured of a plurality of films (the films 24-1, 24-2, and 24-3) being stacked. Consequently, when the auxiliary electrode 24 is brought into contact with the second electrode 17 via the pillars 18, shock to other components is reduced. This is described below.

Figure 10A:
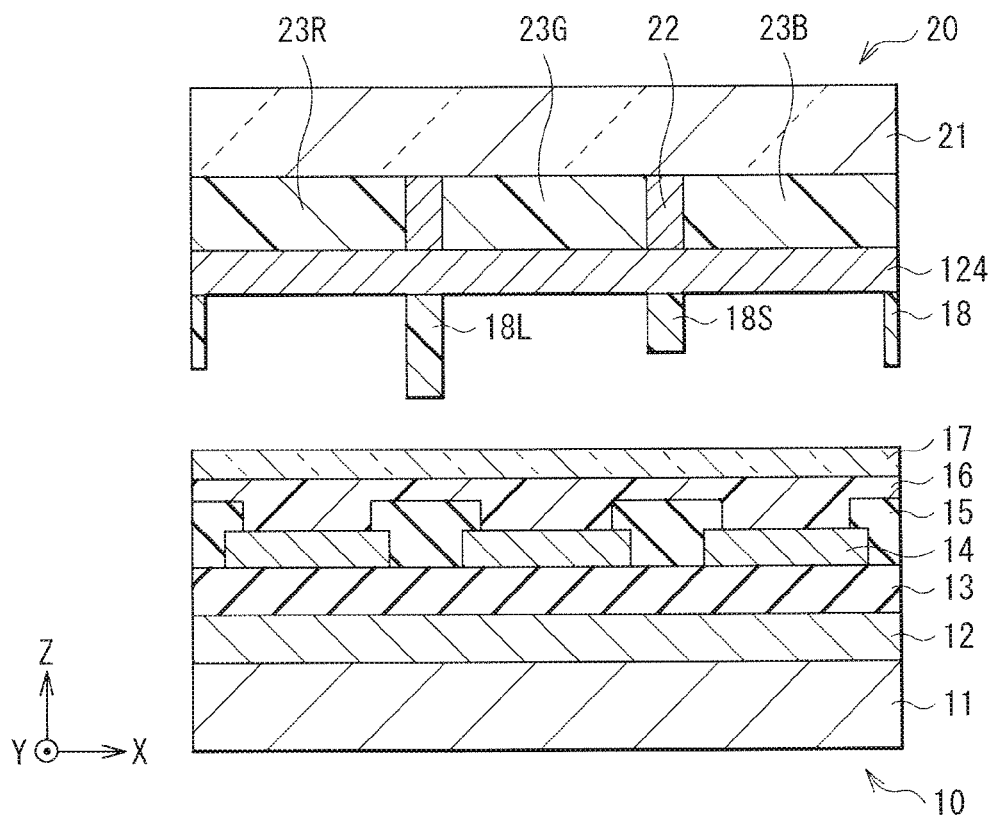
FIG. 10A is a section diagram illustrating a step of manufacturing a display unit according to a comparative example.
Figure 10B:
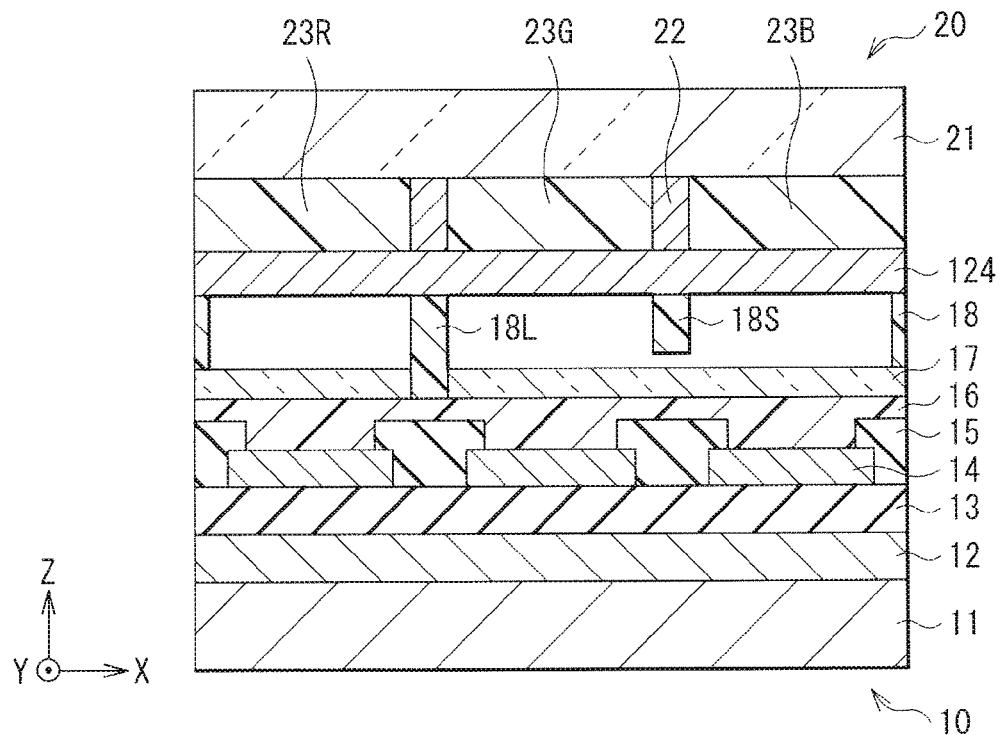
FIG. 10B is a section diagram illustrating a step following the step of FIG. 10A.

FIGS. 10A and 10B illustrate a bonding step of the sealing panel 20 and the device panel 10 of a display unit according to a comparative example. This sealing panel 20 includes a single-film auxiliary electrode (an auxiliary electrode 124). Although the pillars 18 may be provided on any one of the sealing panel 20 and the device panel 10, the following description is made on a case where the pillars 18 are provided on the sealing panel 20.

When lengths of the pillars 18 are different from one another, and when the pillars 18 are brought into contact with the second electrode 17, the single-film auxiliary electrode 124 is less likely to be absorb shock. Hence, the shock is directly transmitted to other components, for example, the device substrate 11 and the sealing substrate 21, and the components may be damaged. Specifically, if the sealing panel 20 is brought close to the device panel 10 such that a relatively short pillar 18 (a pillar 18S in FIGS. 10A and 10B) come into contact with the second electrode 17, a relatively long pillar 18 (a pillar 18L in FIGS. 10A and 10B) is strongly pressed to the second electrode 17 (the device panel 10). This results in pressure on the device substrate 11, and also pressure on the sealing substrate 21 due to repulsive force of the pressure. Such pressure may cause damage to each of the device substrate 11 and the sealing substrate 21. On the other hand, if a distance between the sealing panel 20 and the device panel 10 is adjusted in accordance with the relatively long pillar 18, the relatively short pillar 18S is not in contact with the second electrode 17, leading to a possibility of bad connection between the second electrode 17 and the auxiliary electrode 124.

In contrast, in the display unit 1, since the auxiliary electrode 24 is configured of the plurality of films 24-1, 24-2, and 24-3 being stacked, when the pillars 18 formed on the device panel 10 come into contact with the auxiliary electrode 24 (FIGS. 8A and 8B), shock is gradually attenuated while being transferred from the film 24-3 to the film 24-2 and from the film 24-2 to the film 24-1. In particular, when the space S is provided between each two of the films 24-1, 24-2 and 24-3, the shock is extremely attenuated. In other words, when the auxiliary electrode 24 is brought into contact with the second electrode 17 via the pillars 18, shock to other components is reduced. Consequently, pressure on each of the device substrate 11 and the sealing substrate 21 is low compared with the case where the single-film auxiliary electrode 124 is provided, and such substrates are prevented from being damaged.

In the auxiliary electrode 24 configured of the plurality of the films 24-1, 24-2, and 24-3, it is possible to adjust thickness of each of the films 24-1, 24-2, and 24-3 to be smaller than thickness of the single-film auxiliary electrode 124 so that the pillars 18 easily penetrate through the films 24-2 and 24-3. Consequently, when heights of the pillars 18 are different from one another, and when a relatively long pillar 18 is strongly pressed on the auxiliary electrode 24, the films 24-2 and 24-3 (or the film 24-3) tear before the pressure is transferred to the sealing substrate 21 and the substrate 11, and the pillar 18 penetrates through the films 24-2 and 24-3. Hence, pressure from the pillar 18 is released before being transferred to the substrate 11 and the sealing substrate 21. It is therefore possible to prevent the substrate 11 and the sealing substrate 21 from being damaged.

Furthermore, since the relatively long pillar 18 penetrates through the films 24-2 and 24-3 (or the film 24-3), the relatively short pillar 18 easily comes into contact with the film 24-1 (or the film 24-2). Since each pillar 18 may be in contact with one of the films 24-1, 24-2, and 24-3, electrical connection between the pillars 18 and the auxiliary electrode 24, i.e., electrical connection between the second electrode 17 and the auxiliary electrode 24 is easily established. Consequently, the auxiliary electrode 24 sufficiently fulfills its function, so that it is possible to prevent unevenness in luminance within the display region 110 caused by voltage drop. Consequently, display quality is allowed to be improved.

As described above, in the display unit 1, since the auxiliary electrode 24 is configured of the plurality of films 24-1, 24-2, and 24-3 being stacked, when the auxiliary electrode 24 is brought into contact with the second electrode 17 of the organic light emitting elements 10R, 10G, and 10B via the pillars 18, shock is gradually attenuated while being transferred through the films 24-1, 24-2, and 24-3. Consequently, shock transferred to other components, for example, the device substrate 11 and the sealing substrate 21 is reduced, and it is possible to prevent such substrates from being damaged.

While Modifications of the first embodiment are described below, the same constitutional portions as those in the first embodiment are designated by the same numerals in the following description, and description of them is appropriately omitted.

<Modification 1>

Figure 11:
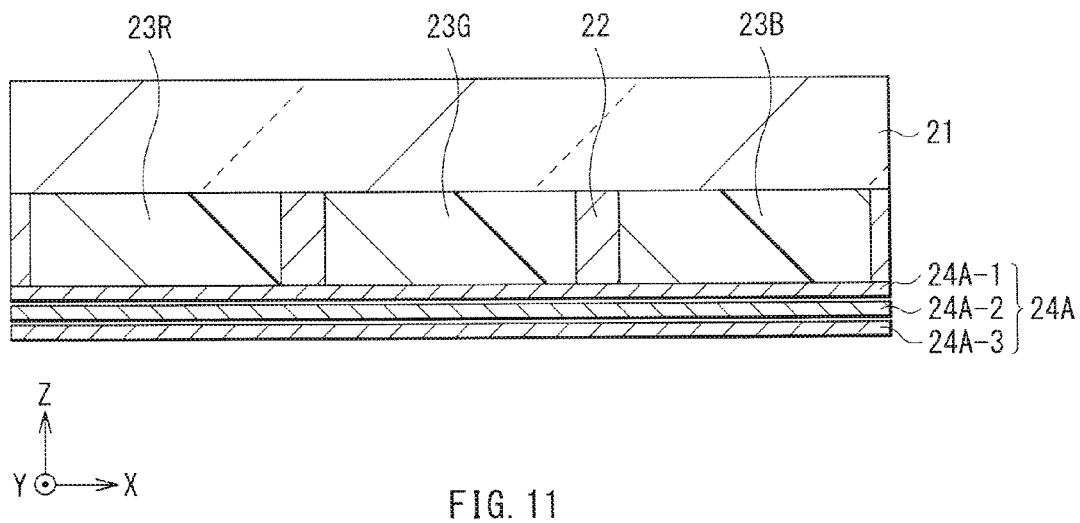
FIG. 11 is a section diagram illustrating a configuration of an auxiliary electrode of a display unit according to Modification 1.

FIG. 11 illustrates an auxiliary electrode (auxiliary electrode 24A) of a display unit according to a modification (Modification 1) of the first embodiment. The auxiliary electrode 24A includes a plurality of films (films 24A-1, 24A-2, and 24A-3) as with the auxiliary electrode 24, but the films 24A-1, 24A-2, and 24A-3 are different in Young's modulus or film density from one another. The auxiliary electrode 24A has a configuration similar to that of the auxiliary electrode 24 except for such a point, and also has functions and effects similar to those of the auxiliary electrode 24.

The auxiliary electrode 24A is configured of the film 24A-1, the film 24A-2, and the film 24A-3 stacked in this order from a position close to the sealing substrate 21. The Young's moduli of the films 24A-1, 24A-2, and 24A-3 may each be, for example, 5000 N/mm$^2$ to 50000 N/mm$^2$ both inclusive, and the Young's modulus is preferably decreased in order of the film 24A-1, the film 24A-2, and the film 24A-3 (Young's modulus: the film 24A-1>the film 24A-2>the film 24A-3). In other words, the Young's moduli of the films 24A-1, 24A-2, and 24A-3 are preferably in decreasing order along a direction from the sealing substrate 21 to the device substrate 11. For example, each of the films 24A-1, 24A-2, and 24A-3 containing aluminum may be allowed to be adjusted in Young's modulus by adding copper, nickel, or the like into the film. Through adjusting the Young's modulus of each of the films 24A-1, 24A-2, and 24A-3 in this way, the film 24A-3 nearest to the pillars 18 (FIG. 1) easily tears, while the film 24A-1 most away from the pillars 18 hardly tears. Consequently, when force is applied to the auxiliary electrode 24A from the pillars 18 (FIGS. 8A and 8B), while the film 24A-3 tears to release the force, the auxiliary electrode 24A is easily connected to the pillars 18 at the film 24A-1. Consequently, the display unit having such an auxiliary electrode 24A makes it possible to prevent the device substrate 11 and the sealing substrate 21 from being damaged, maintain electrical connection between the auxiliary electrode 24A and the second electrode 17 of the organic light emitting elements 10R, 10G, and 10B, and prevent unevenness in luminance due to voltage drop.

Alternatively, the films 24A-1, 24A-2, and 24A-3 may be different in film density from one another. For example, the film density is preferably decreased in order of the film 24A-1, the film 24A-2, and the film 24A-3 (film density: the film 24A-1>the film 24A-2>the film 24A-3). In other words, the film densities of the films 24A-1, 24A-2, and 24A-3 are preferably in decreasing order along a direction from the sealing substrate 21 to the device substrate 11. For example, it may be possible to adjust the film density of each of the films 24A-1, 24A-2, and 24A-3 by altering a film formation condition. Through adjusting the thickness of each of the films 24A-1, 24A-2, and 24A-3 in this way, the film 24A-3 nearest to the pillars 18 (FIG. 1) easily tears, while the film 24A-1 most away from the pillars 18 hardly tears, as with the case of adjustment of the Young's modulus. Consequently, the display unit having such an auxiliary electrode 24A makes it possible to prevent the device substrate 11 and the sealing substrate 21 from being damaged, maintain electrical connection between the auxiliary electrode 24A and the second electrode 17 of the organic light emitting elements 10R, 10G, and 10B, and prevent unevenness in luminance due to voltage drop.

<Modification 2>

Figure 12:
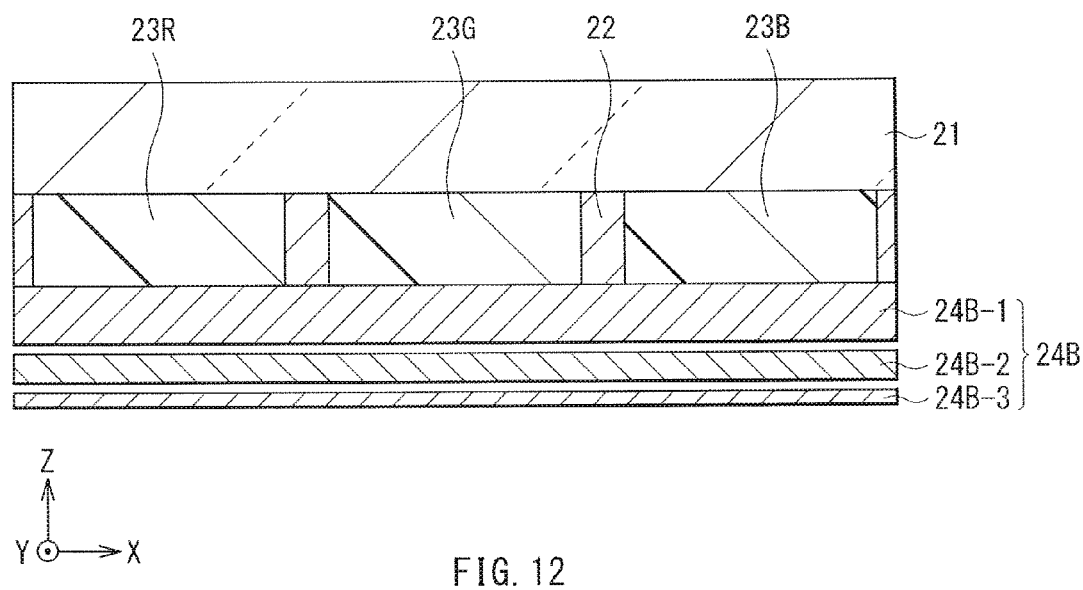
FIG. 12 is a section diagram illustrating a configuration of an auxiliary electrode of a display unit according to Modification 2.

As illustrated in FIG. 12, films (films 24B-1, 24B-2, and 24B-3) configuring an auxiliary electrode (auxiliary electrode 24B) may have thicknesses different from one another (Modification 2).

The auxiliary electrode 24B is configured of the film 24B-1, the film 24B-2, and the film 24B-3 stacked in this order from a position close to the sealing substrate 21. For example, the films 24B-1, 24B-2, and 24B-3 may be configured of the same material. The thicknesses of the films 24B-1, 24B-2, and 24B-3 are preferably sequentially in decreasing order (thickness: the film 24B-1>the film 24B-2>the film 24B-3). In other words, the thicknesses of the films 24B-1, 24B-2, and 24B-3 are preferably in decreasing order along a direction from the sealing substrate 21 to the device substrate 11. For example, the thicknesses of the films 24B-1, 24B-2, and 24B-3 may be 2.5 μm to 4.0 μm both inclusive, 1.2 μm to 2.0 μm both inclusive, and 0.5 μm to 0.8 μm both inclusive, respectively. Through adjusting the thicknesses of the films 24B-1, 24B-2, and 24B-3 in this way, the film 24B-3 nearest to the pillars 18 (FIG. 1) easily tears, while the film 24B-1 most away from the pillars 18 hardly tears, as with the Modification 1. Consequently, the display unit having such an auxiliary electrode 24B makes it possible to prevent the device substrate 11 and the sealing substrate 21 from being damaged, maintain electrical connection between the auxiliary electrode 24B and the second electrode 17 of the organic light emitting elements 10R, 10G, and 10B, and prevent unevenness in luminance due to voltage drop.

<Modification 3>

Figure 13:
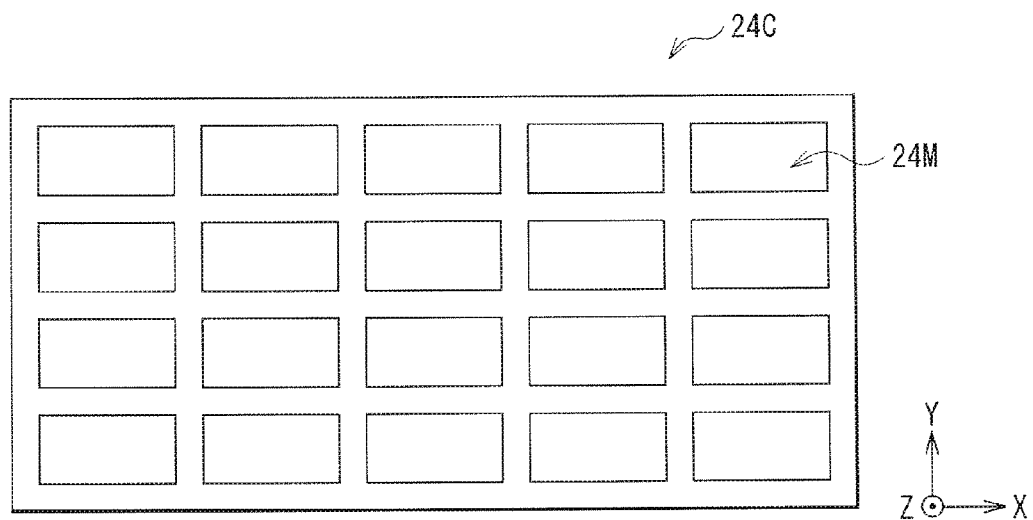
FIG. 13 is a plan diagram illustrating a configuration of an auxiliary electrode of a display unit according to Modification 3.

FIG. 13 illustrates a planar configuration of an auxiliary electrode (auxiliary electrode 24C) of a display unit according to a modification (Modification 3) of the first embodiment. The auxiliary electrode 24C includes a plurality of openings 24M. The auxiliary electrode 24C has a configuration similar to that of the auxiliary electrode 24 except for such a point, and also has functions and effects similar to those of the auxiliary electrode 24.

Figure 14:
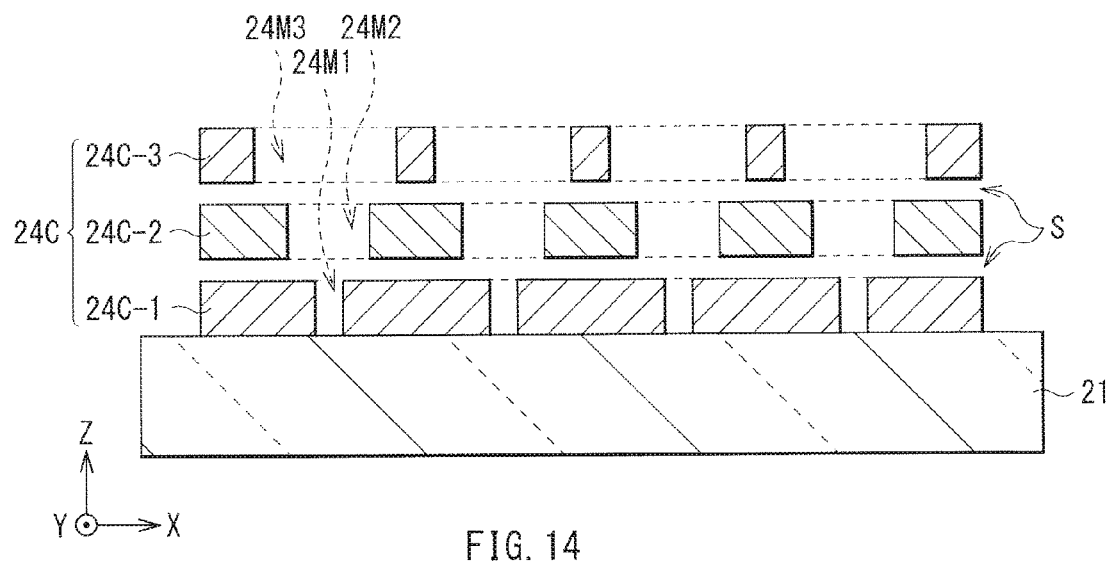
FIG. 14 is a section diagram illustrating an example of the configuration of the auxiliary electrode illustrated in FIG. 13.

As illustrated in FIG. 14, the auxiliary electrode 24C includes a plurality of films (films 24C-1, 24C-2, and 24C-3). Such films 24C-1, 24C-2, and 24C-3 are stacked in this order from a position close to the sealing substrate 21. For example, the openings 24M of the auxiliary electrode 24C may be provided at positions opposed to light emitting regions of the organic light emitting elements 10R, 10G, and 10B, and may be arranged in a matrix. A low light-transmissive material may be used for the films 24C-1, 24C-2, and 24C-3 having the openings 24M. For example, the films 24C-1, 24C-2, and 24C-3 may each be configured of aluminum (Al), silver (Ag), gold (Au), copper (Cu), chromium (Cr), zinc (Zn), iron (Fe), tungsten (W), steel use stainless (SUS), cobalt (Co), or the like. Since aluminum is relatively easily oxidized, a surface of aluminum is preferably covered with molybdenum (Mo), titanium (Ti), or the like to configure the films 24C-1, 24C-2, and 24C-3.

The films 24C-1, 24C-2, and 24C-3 have openings 24M1, 24M2, and 24M3, respectively. The films 24C-1, 24C-2, and 24C-3 preferably have open area ratios in sequentially increasing order. The openings 24M1, 24M2, and 24M3 may have sizes different from one another (FIG. 14). Alternatively, the films 24C-1, 24C-2, and 24C-3 may have different numbers of openings 24M1, 24M2, and 24M3 from one another. Consequently, the film 24C-3 nearest to the pillars 18 (FIG. 1) easily tears, while the film 24C-1 most away from the pillars 18 hardly tears, as with the Modification 1. Consequently, the display unit having such an auxiliary electrode 24C makes it possible to prevent the device substrate 11 and the sealing substrate 21 from being damaged, maintain electrical connection between the auxiliary electrode 24C and the second electrode 17 of the organic light emitting elements 10R, 10G, and 10B, and prevent unevenness in luminance due to voltage drop.

Although each of the openings 24M1, 24M2, and 24M3 is preferably smaller than the outer diameter (in an XY plane of FIG. 1) of the pillar 18, the openings 24M1, 24M2, and 24M3 may be larger the outer diameter of the pillar 18 as long as positions of the openings 24M1, 24M2, and 24M3 are arranged at different positions from one another. The openings 24M1 in a film 24C-1 plane, the openings 24M2 in a film 24C-2 plane, and openings 24M3 in a film 24C-3 plane are each preferably constant in distribution density.

<Second Embodiment>

Figure 15:
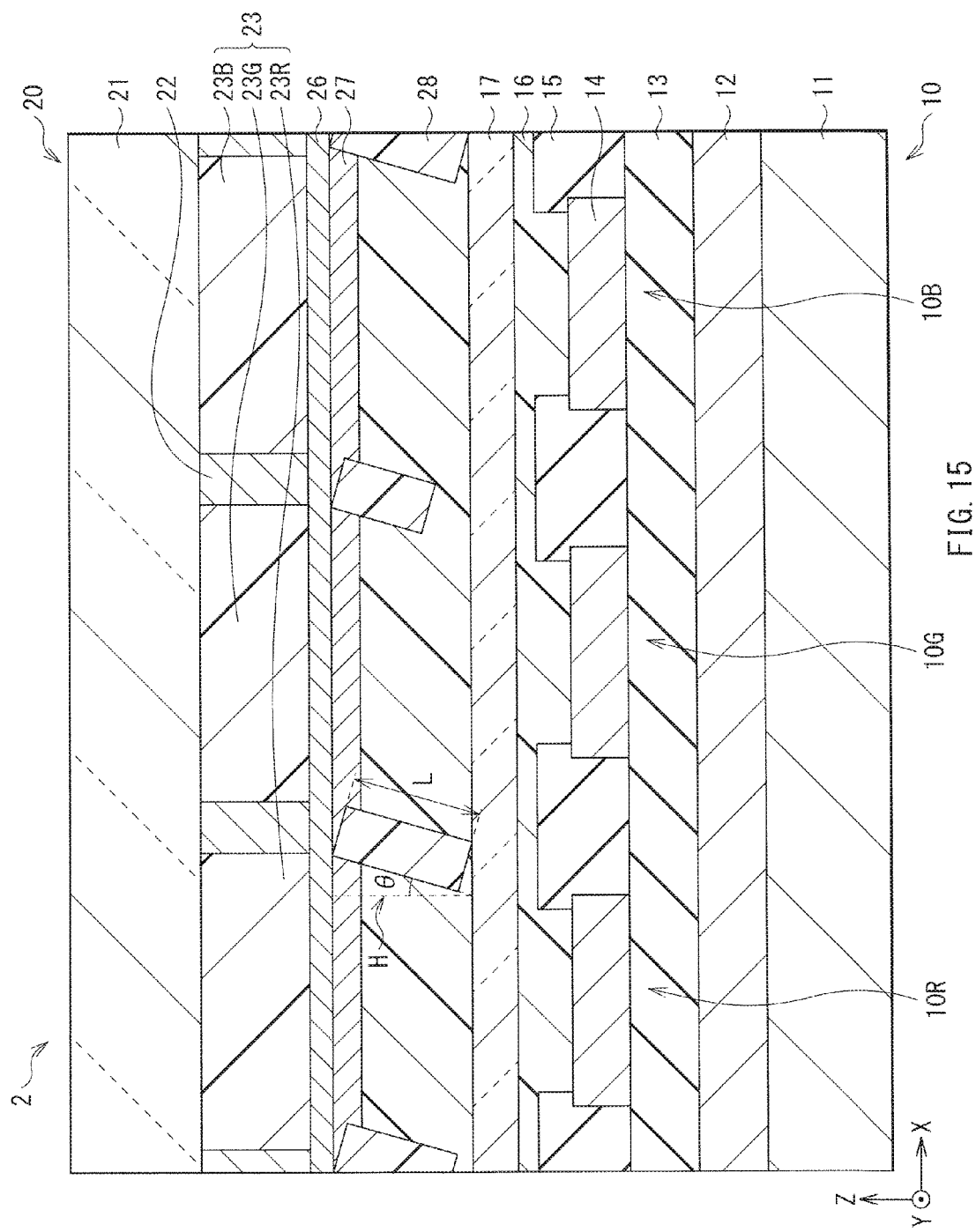
FIG. 15 is a section diagram illustrating a configuration of a display unit according to a second embodiment of the present technology.

FIG. 15 illustrates a sectional configuration of a display unit (display unit 2) according to a second embodiment of the present technology. Pillars (pillars 28) of the display unit 2 are inclined to respective substrate surfaces (respective facing surfaces of the device substrate 11 and the sealing substrate 21) of the device substrate 11 and the sealing substrate 21. The display unit 2 has a configuration similar to that of the display unit 1 except for such a point, and also has functions and effects similar to those of the display unit 1.

The pillars 28 electrically connect an auxiliary electrode (an auxiliary electrode 26) to the second electrode 17 of the organic light emitting elements 10R, 10G, and 10B, as with the first embodiment. For example, the auxiliary electrode 26 may have a single-film structure, and may be configured of the above-described material for the auxiliary electrode. Each of the pillars 28 of the display unit 2 is provided such that a straight line in its longitudinal direction (major-axis direction) forms an angle θ (0°<θ<90° with respect to a perpendicular H to a surface of the device substrate 11 (or sealing substrate 21). Although the angle θ is preferably larger, the angle θ is adjusted such that when length of each pillar 28 is denoted as L, L×sin θ does not exceed width of the dividing wall 15. One end of the pillar 28, the end being at a position relatively close to the sealing substrate 21, is provided within a conductive resin layer 27.

The conductive resin layer 27 is provided so as to cover the auxiliary electrode 26, and, for example, may be configured of resin such as polyimide or the like in which a conductive component such as carbon nanotube, metal, or the like is dispersed. The conductive resin layer 27 preferably includes a resin having high viscosity. The conductive resin layer 27 fixes disposition of the pillars 28 inclined with respect to the device substrate 11 (or the sealing substrate 21), and maintains electrical connection between the auxiliary electrode 26 and the pillars 28. When the device panel 10 is bonded to the sealing panel 20 (see FIGS. 8A and 8B), and when pressure larger than a predetermined pressure is applied to the pillars 28, the pillars 28 are preferably detached from the conductive resin layer 27. Such holding force of the conductive resin layer 27 on the pillars 28 is adjusted by the thickness of the conductive resin layer 27, a constitutional material of the conductive resin layer 27, and the like. For example, the conductive resin layer 27 may have a thickness of 5 μm.

Figure 16:
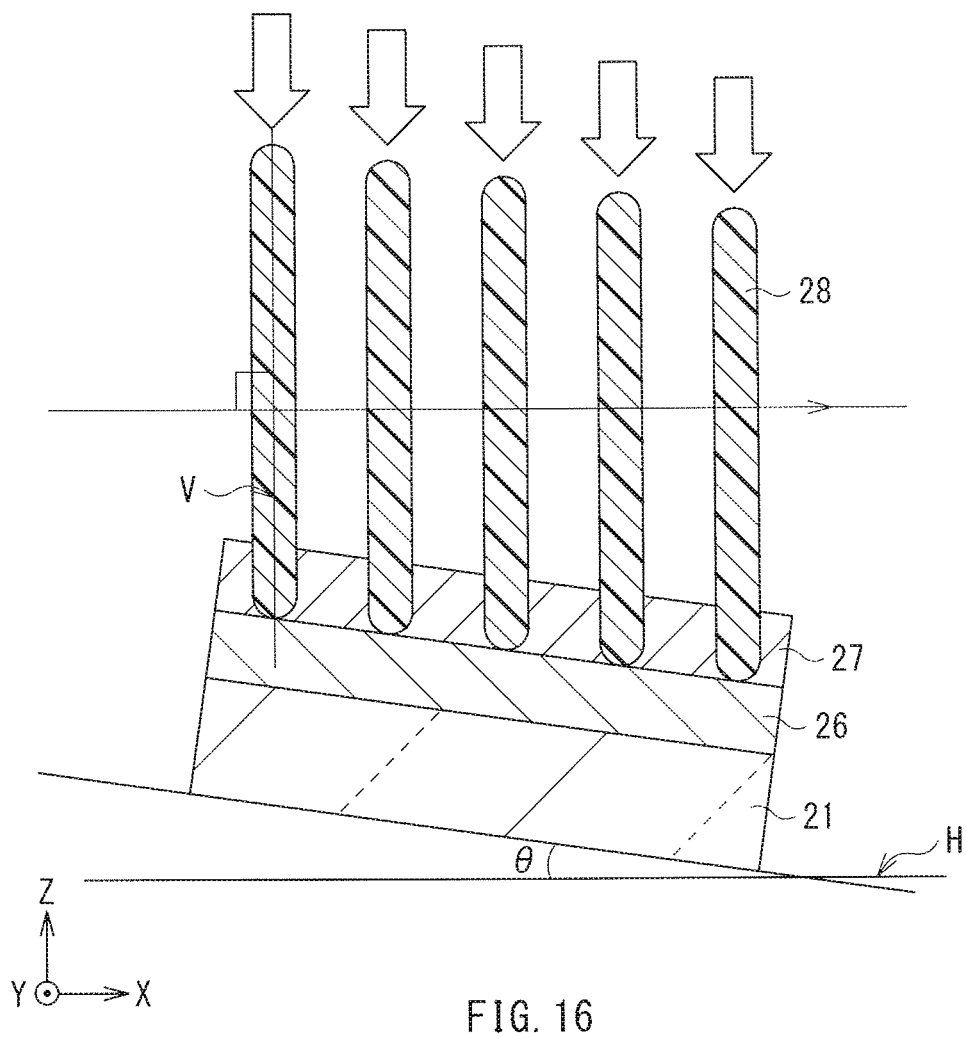
FIG. 16 is a section diagram illustrating an exemplary step of forming pillars illustrated in FIG. 15.

For example, the pillars 28 may be formed as follows (FIG. 16).

First, as described in the first embodiment, the black matrix 22, the color filter 23, the overcoat layer, and the auxiliary electrode 26 are formed on the sealing substrate 21 (see FIG. 7). Subsequently, conductive resin for configuring the conductive resin layer 27 is applied onto the auxiliary electrode 26, and then the sealing substrate 21 is inclined at an angle θ with respect to a horizontal plane H. On the other hand, the pillars 28 are beforehand prepared, for example, by molding a conductive resin into a columnar shape. The sealing substrate 21 is inclined, and then the pillars 28 are inserted into the conductive resin along a vertical line V. Subsequently, the conductive resin is cured using light or heat to form the conductive resin layer 27. Consequently, ends of the pillars 28 are embedded in the conductive resin layer 27, so that positions of the pillars 28 are fixed.

In each of such pillars 28, a distance (hereinafter referred to as apparent length) occupied by the pillar 28 in a direction perpendicular to the device substrate 11 and the sealing substrate 21 is shorter than the actual length L of the pillar 28. Consequently, variation in apparent length (length L' in FIG. 17B described later) of the pillar 28 becomes smaller than variation in length L of the pillar 28. This is described below (FIGS. 17A and 17B).

Figure 17A:
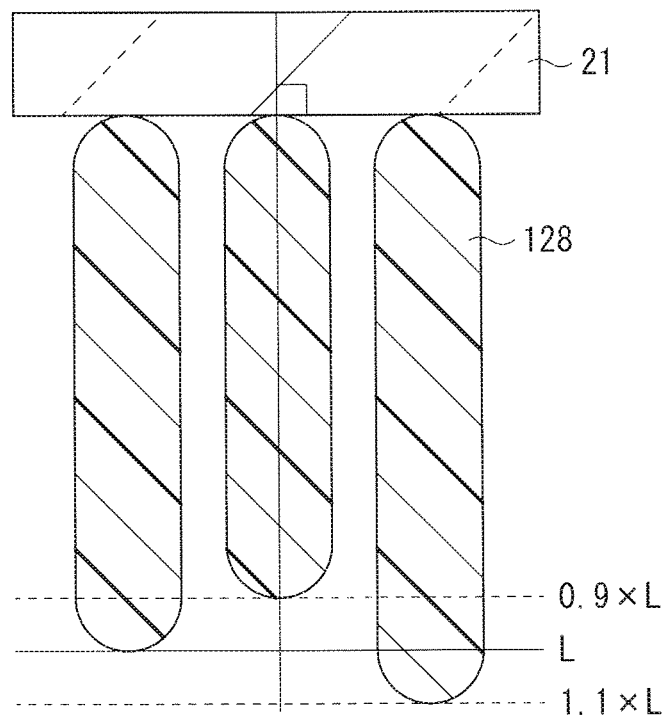
FIG. 17A is a section diagram illustrating a configuration of pillars disposed in a direction perpendicular to a sealing substrate.
Figure 17B:
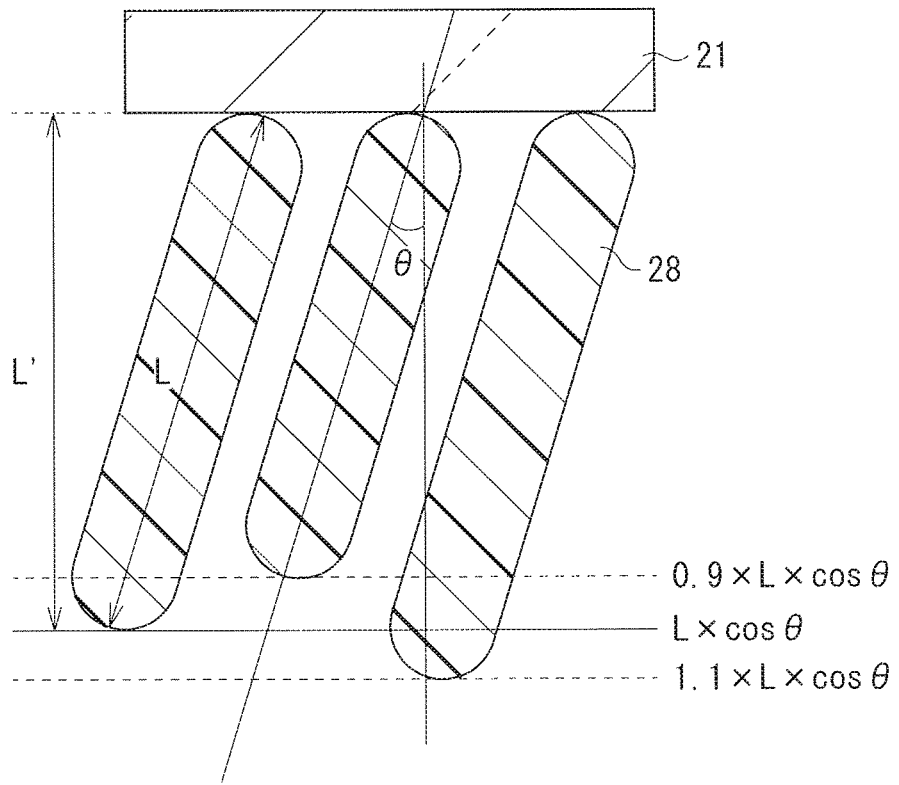
FIG. 17B is a section diagram for explaining apparent length of each of the pillars illustrated in FIG. 15.

FIG. 17A is a schematic diagram of pillars (pillars 128) disposed such that longitudinal direction of each pillar is perpendicular to a substrate surface of the sealing substrate 21. When such a pillar 128 varies in actual length L within a range from −10% (0.9×L) to 10% (1.1×L), variation in distance occupied by the pillar 128 in a direction perpendicular to the sealing substrate 21 is equal to variation in actual length L. In other words, variation in apparent length of the pillar 128 is 0.9×L to 1.1×L. Pressure on each of the device substrate 11 and the sealing substrate 21 increases with increase in variation in perpendicular length between the device substrate 11 and the sealing substrate 21, i.e., variation in apparent length of the pillar 128.

On the other hand, when the pillars 28 are disposed while being inclined at an angle θ from a perpendicular direction with respect to the sealing substrate 21 (FIG. 17B), an apparent length L' of each pillar 28 is represented as the following Formula (1). Hence, when the actual length L of the pillar 28 varies within a range from −10% (0.9×L) to 10% (1.1×L), the apparent length L' of the pillar 28 varies within a range from 0.9×L×cos θ to 1.1×L×cos θ. Since cos θ is less than 1, variation in apparent length L' of the pillar 28 is smaller than variation in apparent length of the pillar 128 (or variation in actual length L of the pillar 28).

Formula (1)

$$L' = L \times \cos\theta \quad (1)$$

Thus, in the pillars 28, variation in apparent length L' is smaller than variation in actual length L. Hence, when the auxiliary electrode 26 is brought into contact with the second electrode 17 of the organic light emitting elements 10R, 10G, and 10B via the pillars 28, force applied to each of the device panel 10 and the sealing panel 20 is reduced. In other words, when the pillars 28 are formed, shock to other components is reduced. Consequently, it is possible to prevent damage to other components such as the device substrate 11, the sealing substrate 21, and the like.

Furthermore, since the pillars 28 are inclined to the substrate surface of each of the device substrate 11 and the sealing substrate 21, force applied to each pillar 28 is decomposed into a perpendicular component and a parallel component with respect to the substrate surface. Consequently, force applied to each of the device substrate 11 and the sealing substrate 21 is weak compared with a case where pillars (the pillars 128 in FIG. 17A) are disposed perpendicular to the substrate surface.

<Modification 4>

Figure 18:
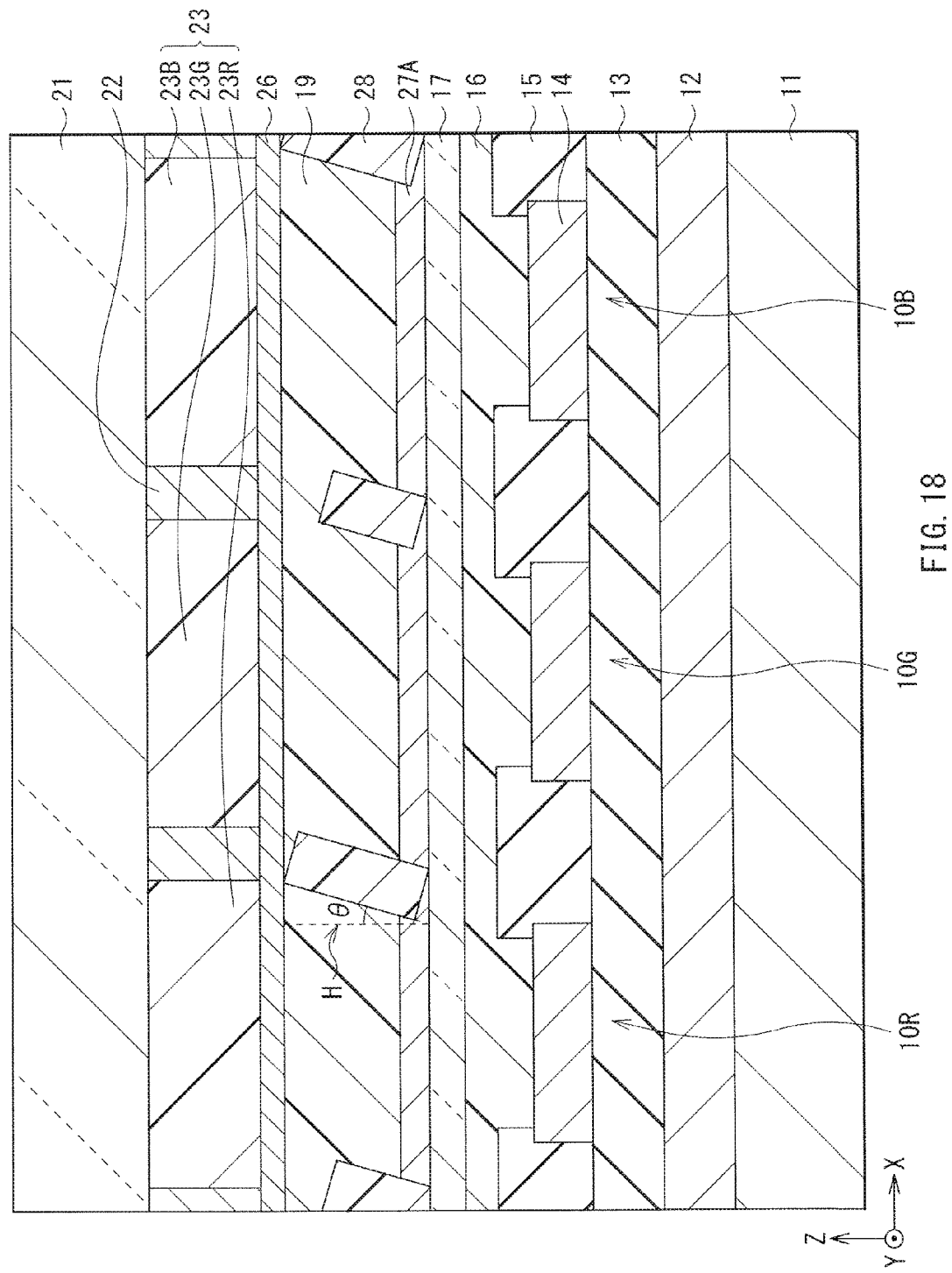
FIG. 18 is a section diagram illustrating a configuration of a display unit according to Modification 4.

As illustrated in FIG. 18, a conductive resin layer (conductive resin layer 27A) may be provided on the second electrode 17 of the organic light emitting elements 10R, 10G, and 10B, and an end of each pillar 28, the end being at a position close to the device substrate 11, may be embedded in the conductive resin layer 27A. For example, the pillars 28 are embedded in the conductive resin layer 27A along a vertical line after the device substrate 11 is inclined with respect to a horizontal plane.

The two ends (an end at a position close to the sealing substrate 21 and an end at a position close to the device substrate 11) of each pillar 28 may be provided within the conductive resin layer 27 or 27A (FIG. 15 or 18).

<Modification 5>

Figure 19:
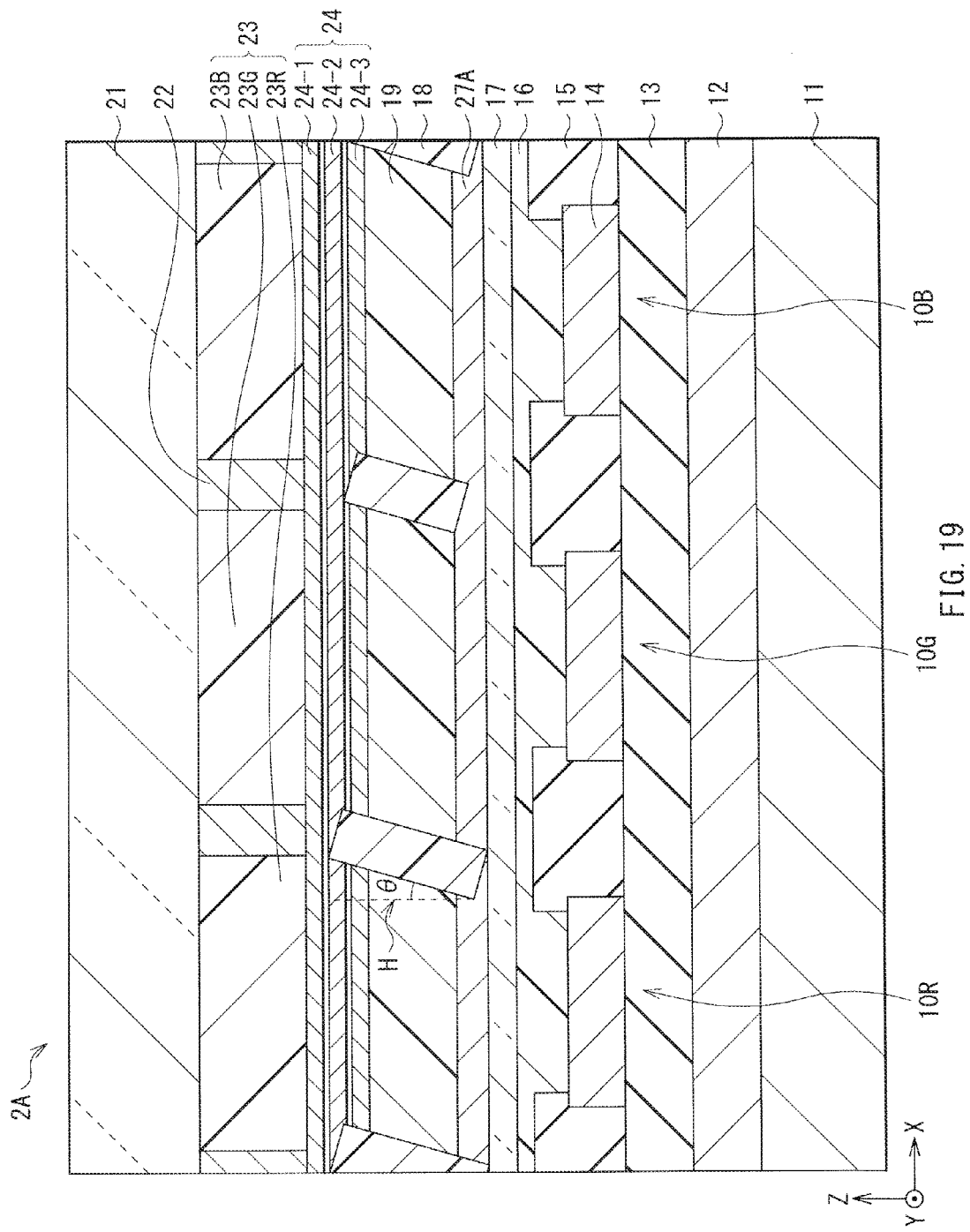
FIG. 19 is a section diagram illustrating a configuration of a display unit according to Modification 5.

FIG. 19 illustrates a sectional configuration of a display unit (display unit 2A) according to Modification 5. The display unit 2A includes the pillars 28 inclined to the respective substrate surfaces of the device substrate 11 and the sealing substrate 21, and an auxiliary electrode 24 configured of a plurality of films (films 24-1, 24-2, and 24-3). The display unit 2A has a configuration similar to that of the display unit 2 except for such a point, and also has functions and effects similar to those of the display unit 2.

In such a display unit 2A, variation in apparent length of the pillar 28 is reduced, and when the auxiliary electrode 24 is brought into contact with the second electrode 17 of the organic light emitting elements 10R, 10G, and 10B via the pillars 18, shock is gradually attenuated while being transferred through the films 24-1, 24-2, and 24-3. Consequently, when the pillars 28 are formed, shock to other components is further reduced.

<Third Embodiment>

Figure 20:
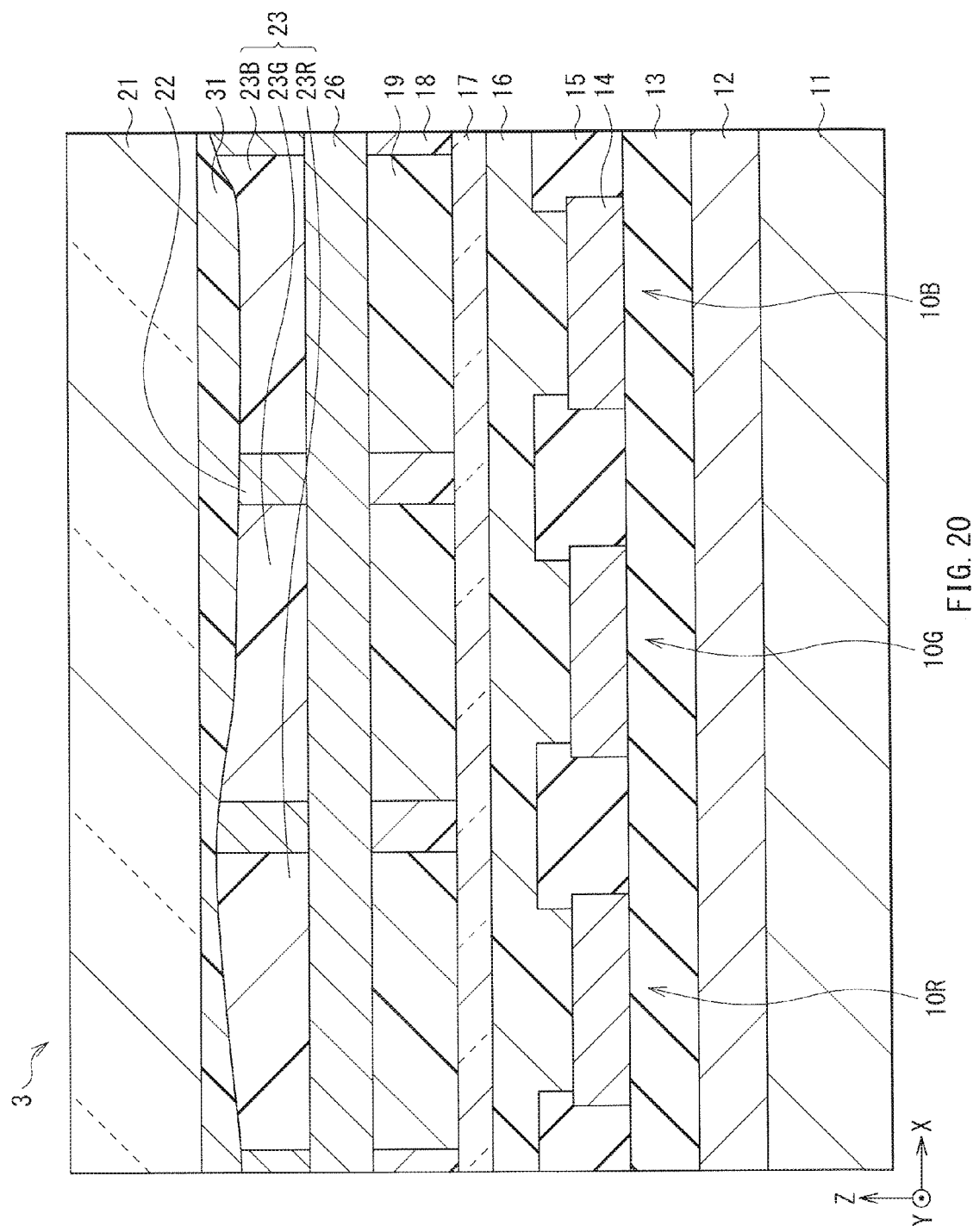
FIG. 20 is a section diagram illustrating a configuration of a display unit according to a third embodiment of the present technology.

FIG. 20 illustrates a sectional configuration of a display unit (display unit 3) according to a third embodiment of the present technology. The sealing panel 20 of the display unit 3 includes a buffer layer 31 between the sealing substrate 21 and the auxiliary electrode 26. The display unit 3 has a configuration similar to that of the display unit 1 or 2 except for such a point, and also has functions and effects similar to those of the display unit 1 or 2.

For example, the buffer layer 31 may be provided over the entire surface of the sealing substrate 21 between the sealing substrate 21 and the black matrix 22 as well as the color filter 23. The buffer layer 31 may be provided between the auxiliary electrode 26 and the black matrix 22 as well as color filter 23. The buffer layer 31 preferably includes a material having a high light-transmissive property and high elasticity or viscoelasticity. The elasticity refers to the following property of a material: when external force is applied to the material, the material deforms in the applied force direction, and when the external force is released, the material returns to an original shape. The viscoelasticity refers to the following property of a material: when external force is applied to the material, the material gradually deforms with the lapse of time, and when the external force is released, the material returns to a shape close to an original shape while distortion remains therein. Specifically, for example, a resin material such as phenol resin, polyimide, and the like having a thickness of about 1 μm may be used for the buffer layer 31. The buffer layer 31 may be configured of silicon oxide (SiO), silicon oxynitride (SiON), silicon nitride (SiN), silicon carbonitride (SiCN), silicon carbide (SiC), or the like having low stress (for example, within ±30 MPa).

For example, the buffer layer 31 may be formed by providing a resin material on the sealing substrate 21 by a coating process. The buffer layer 31 may be formed by an evaporation process, a sputter process, a CVD process, or the like. After the buffer layer 31 is provided, the black matrix 22, the color filter 23, the overcoat layer, and the auxiliary electrode 26 are formed in this order to complete the sealing panel 20.

Figure 21A:
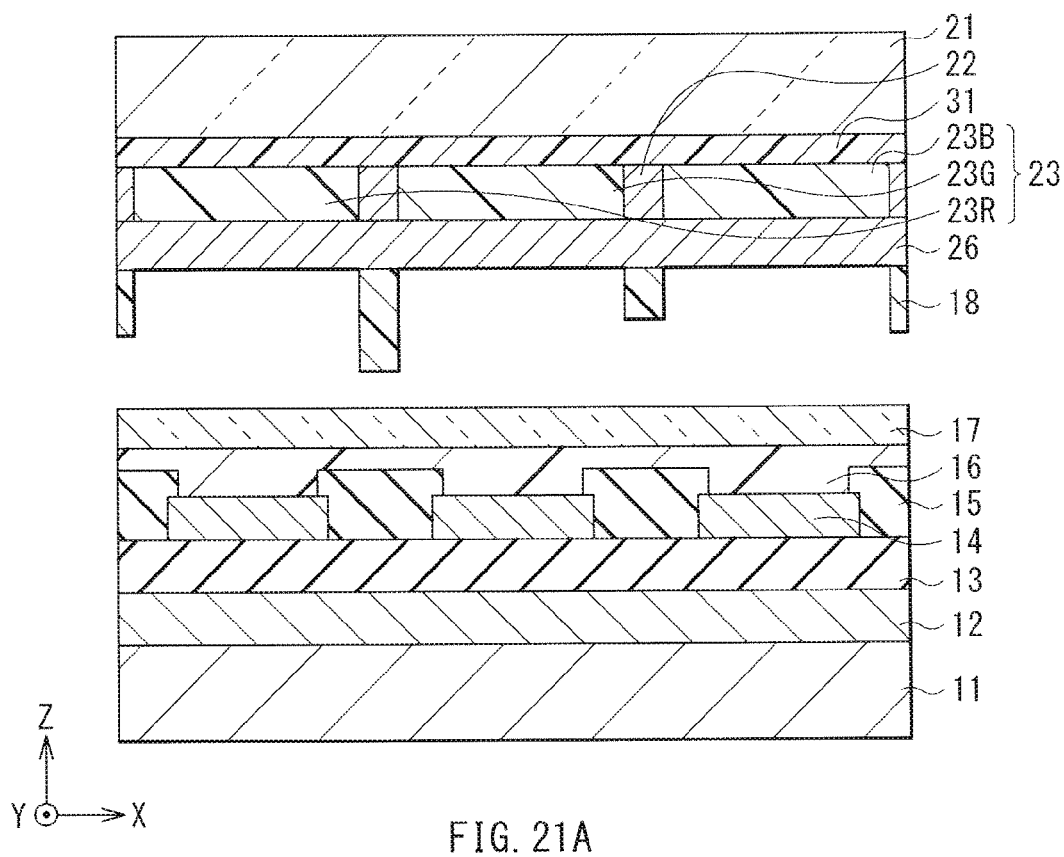
FIG. 21A is a section diagram illustrating a step of manufacturing the display unit illustrated in FIG. 20.
Figure 21B:
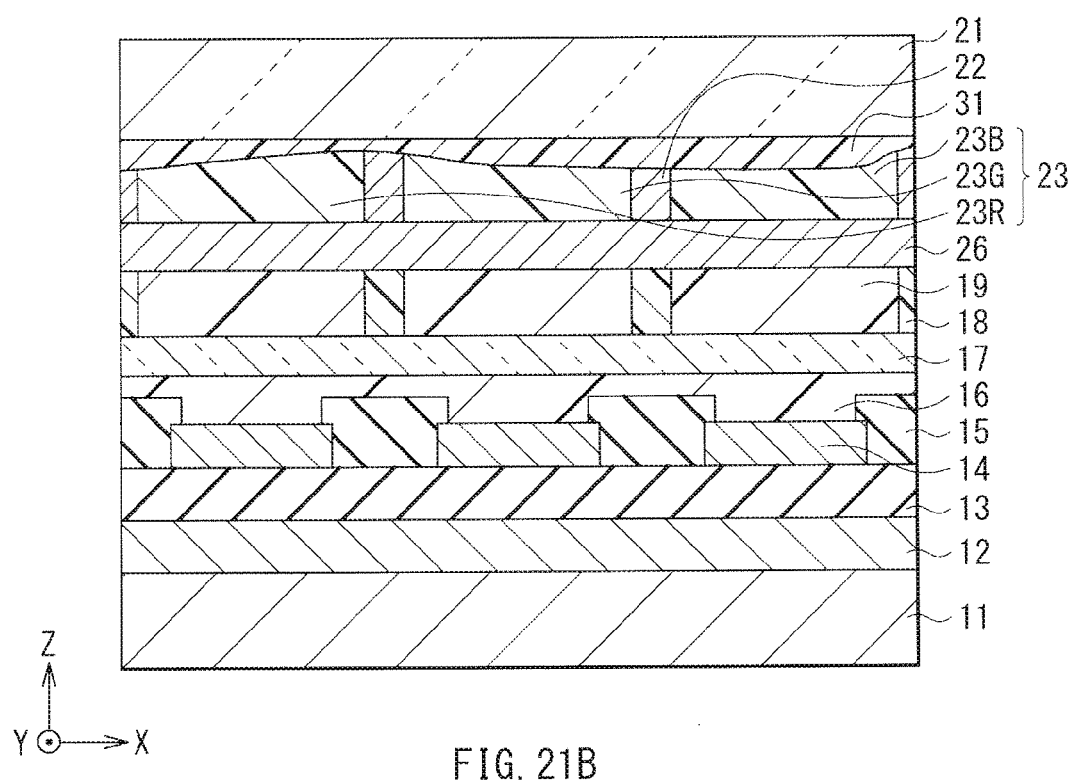
FIG. 21B is a section diagram illustrating a step following the step of FIG. 21A.

In the display unit 3, when the auxiliary electrode 26 is brought into contact with the second electrode 17 of the organic light emitting elements 10R, 10G, and 10B via the pillars 18, shock is absorbed by the buffer layer 31. This is described below (FIGS. 21A and 21B). Although the pillars 18 may be provided on any one of the sealing panel 20 and the device panel 10, the following description is made on a case where the pillars 18 are provided on the sealing panel 20, so that the pillars 18 are brought into contact with the second electrode 17 (FIG. 21A).

In the display unit 3, when the pillars 18 come into contact with the second electrode 17 of the organic light emitting elements 10R, 10G, and 10B, and even if lengths of the pillars 18 are different from one another, the buffer layer 31 in a region corresponding to a relatively long pillar 18 deforms and absorbs shock at the contact (FIG. 21B). Hence, shock to other components is reduced, and a relatively short pillar 18 is allowed to be brought into contact with the second electrode 17. Consequently, in the display unit 3, it is possible to prevent the device substrate 11 and the sealing substrate 21 from being damaged, maintain electrical connection between the auxiliary electrode 26 and the second electrode 17 of the organic light emitting elements 10R, 10G, and 10B via the pillars 18, and prevent unevenness in luminance due to voltage drop.

<Modification 6>

Figure 22:
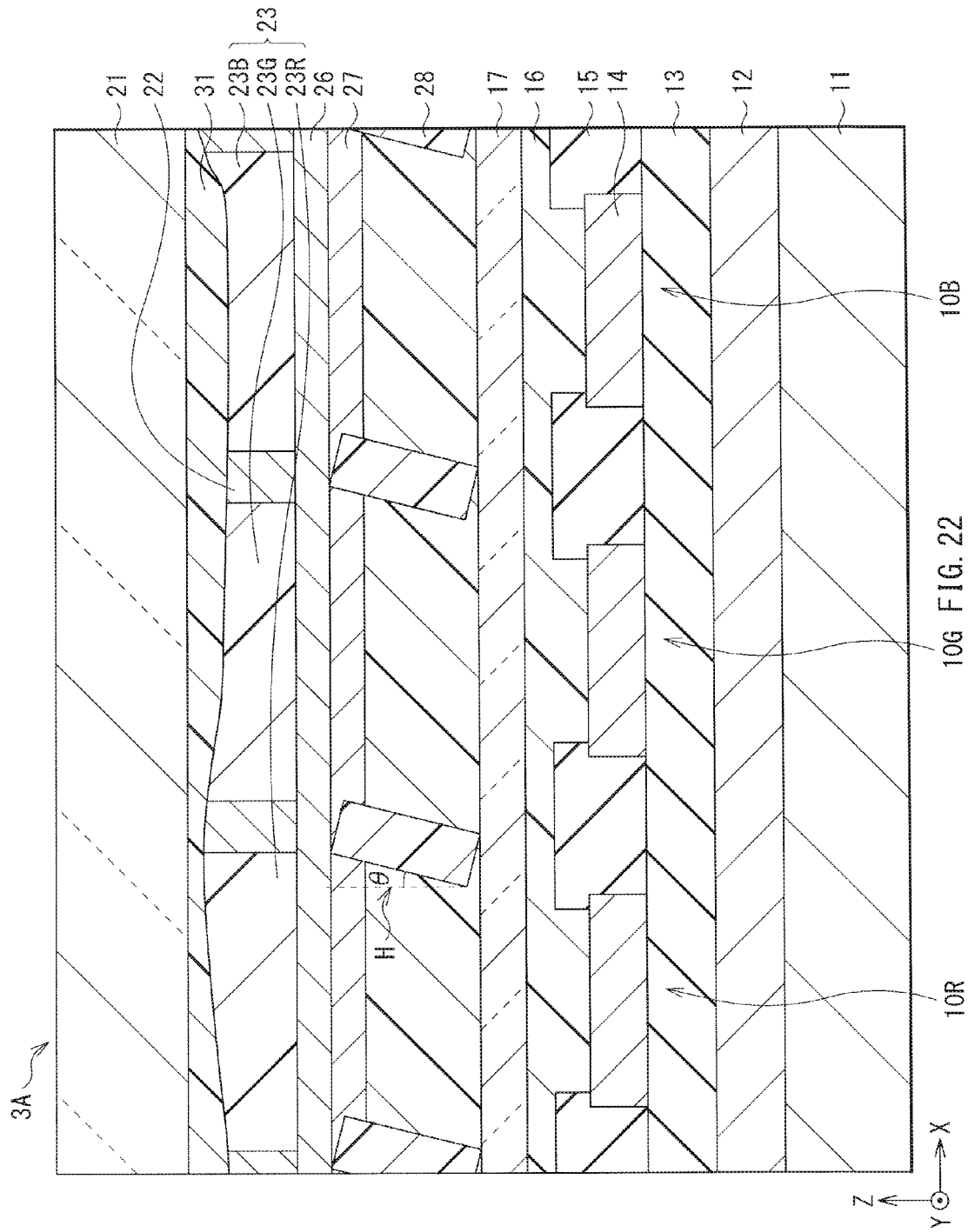
FIG. 22 is a section diagram illustrating a configuration of a display unit according to Modification 6.

FIG. 22 illustrates a sectional configuration of a display unit (display unit 3A) according to Modification 6. The display unit 3A includes the buffer layer 31 and pillars 28 inclined to respective substrate surfaces of the device substrate 11 and the sealing substrate 21. The display unit 3A has a configuration similar to that of the display unit 3 except for such a point, and also has functions and effects similar to those of the display unit 3.

In such a display unit 3A, when the auxiliary electrode 26 is brought into contact with the second electrode 17 of the organic light emitting elements 10R, 10G, and 10B via the pillars 28, shock is absorbed by the buffer layer 31, and variation in apparent length of the pillar 28 is reduced. Consequently, when the pillars 28 are formed, it is possible to reduce shock to other components.

<Modification 7>

Figure 23:
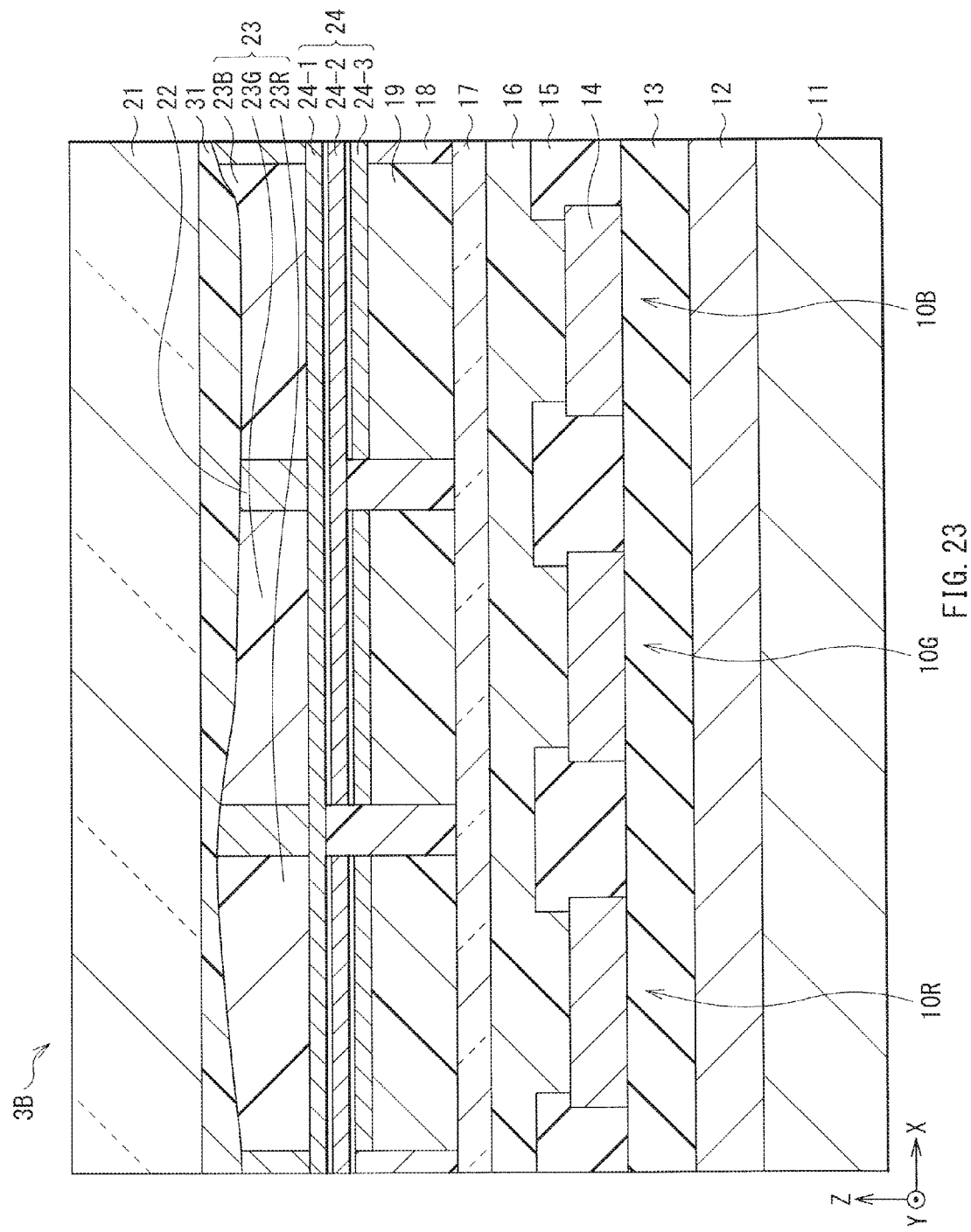
FIG. 23 is a section diagram illustrating a configuration of a display unit according to Modification 7.

FIG. 23 illustrates a sectional configuration of a display unit (display unit 3B) according to Modification 7. The display unit 3B includes the buffer layer 31 and an auxiliary electrode 24 configured of a plurality of films (films 24-1, 24-2, and 24-3). The display unit 3B has a configuration similar to that of the display unit 3 except for such a point, and also has functions and effects similar to those of the display unit 3.

In such a display unit 3B, when the auxiliary electrode 24 is brought into contact with the second electrode 17 of the organic light emitting elements 10R, 10G, and 10B via the pillars 18, shock is absorbed by the buffer layer 31, and is gradually attenuated while being transferred through the films 24-1, 24-2, and 24-3. Consequently, when the pillars 18 are formed, it is possible to further reduce shock to other components.

<Modification 8>

Figure 24:
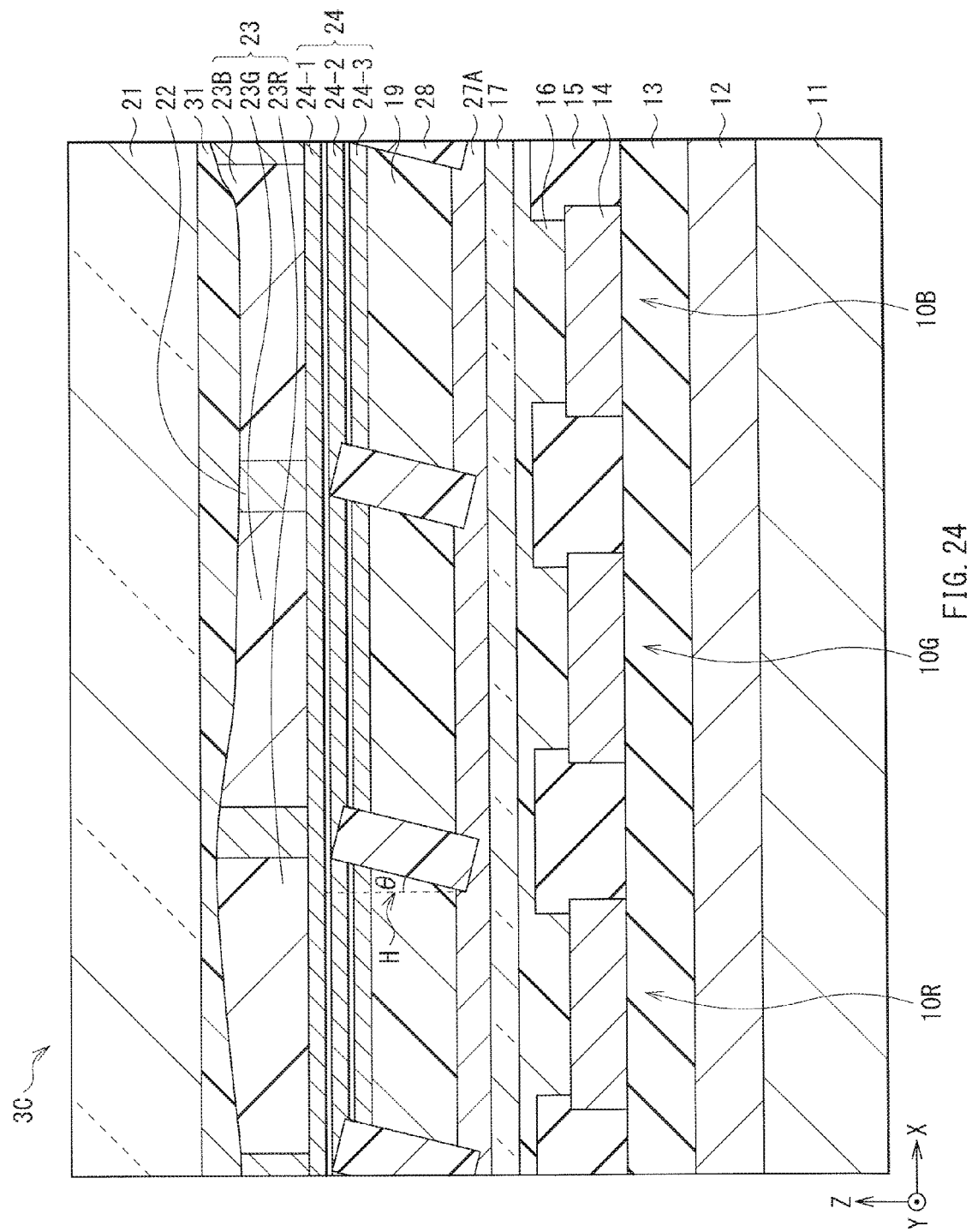
FIG. 24 is a section diagram illustrating a configuration of a display unit according to Modification 8.

FIG. 24 illustrates a sectional configuration of a display unit (display unit 3C) according to Modification 8. The display unit 3B includes the buffer layer 31, an auxiliary electrode 24 configured of a plurality of films (films 24-1, 24-2, and 24-3), and pillars 28 inclined to respective substrate surfaces of the device substrate 11 and the sealing substrate 21. The display unit 3C has a configuration similar to that of the display unit 3 except for such a point, and also has functions and effects similar to those of the display unit 3.

In such a display unit 3C, when the auxiliary electrode 24 is brought into contact with the second electrode 17 of the organic light emitting elements 10R, 10G, and 10B via the pillars 28, shock is absorbed by the buffer layer 31, and is gradually attenuated while being transferred through the films 24-1, 24-2, and 24-3. Furthermore, variation in apparent length of the pillar 28 is reduced. Consequently, when the pillars 28 are formed, it is possible to further reduce shock to other components.

APPLICATION EXAMPLES

Application examples of the display unit (any of the display units 1, 2, 2A, 3A, 3B, and 3C) as described above to electronic apparatuses are now described. Examples of the electronic apparatuses may include a television unit, a digital camera, a notebook personal computer, a mobile terminal device such as a mobile phone, a video camcorder, and the like. In other words, the display unit is applicable to electronic apparatuses in various fields for displaying externally-received or internally-generated image signals as still or video images.

[Module]

Figure 25:
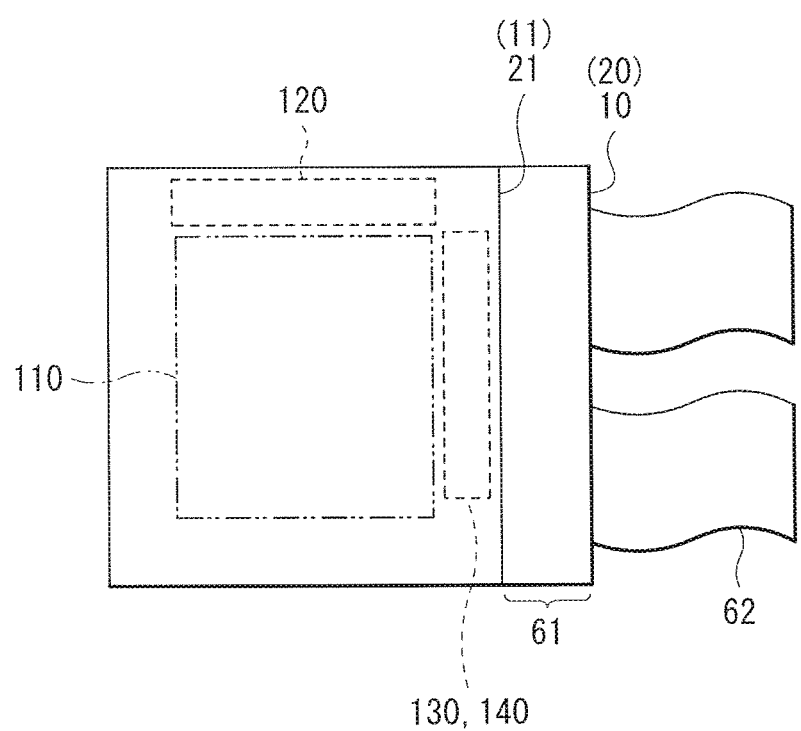

The display unit is built in various electronic apparatuses such as application examples 1 to 7 described below, for example, as a module illustrated in FIG. 25. In the module, for example, one side of the device panel 10 or the sealing panel 20 has a region 61 exposed from a sealing substrate 21 or the device substrate 11, and an external connection terminal (a first peripheral electrode, a second peripheral electrode, and the like) is provided on the exposed region 61 by extending interconnections for the signal-line drive circuit 120, the scan-line drive circuit 130, and the power-supply-line drive circuit 140. The external connection terminal may be attached with a flexible printed circuit (FPC) 62 for input/output of signals.

Application Example 1

Figure 26A:
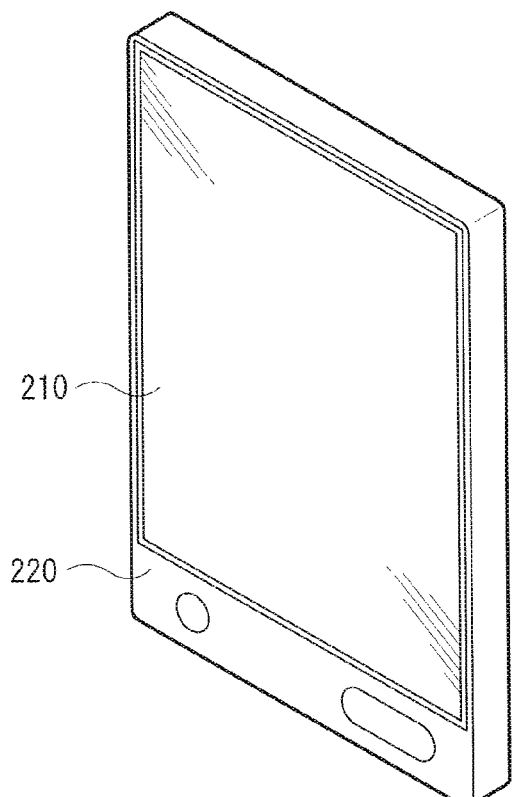
FIG. 26A is a perspective diagram illustrating appearance of application example 1.
Figure 26B:
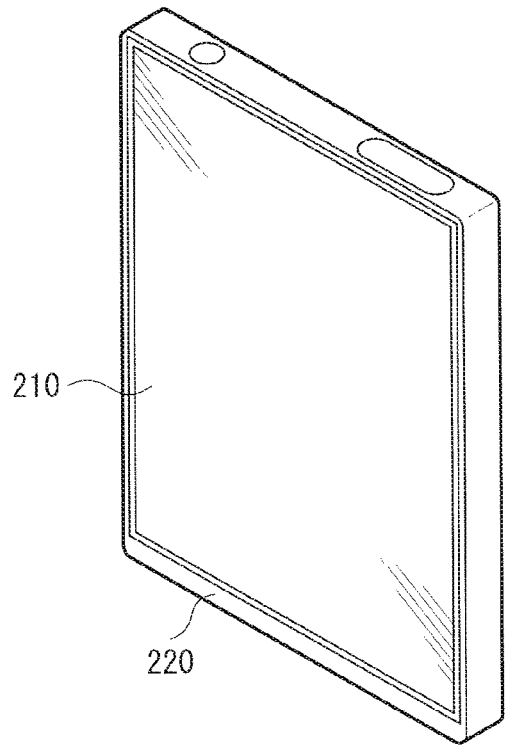
FIG. 26B is another perspective diagram illustrating appearance of the application example 1.

FIGS. 26A and 26B illustrate appearance of an electronic book to which the display unit according to any of the above-described embodiments and Modifications is applied. Such an electronic book may each have, for example, a display section 210 and a non-display section 220. The display section 210 may be configured of the display unit according to any of the above-described embodiments and Modifications.

Application Example 2

Figure 27:
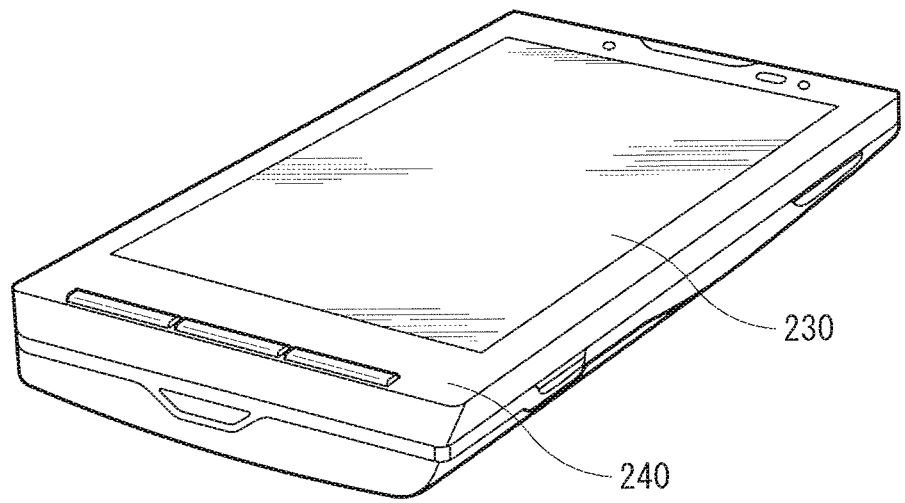
FIG. 27 is a perspective diagram illustrating appearance of application example 2.

FIG. 27 illustrates appearance of a smartphone to which the display unit according to any of the above-described embodiments and Modifications is applied. The smartphone may have, for example, a display section 230 and a non-display section 240. The display section 230 may be configured of the display unit according to any of the above-described embodiments and Modifications.

Application Example 3

Figure 28:
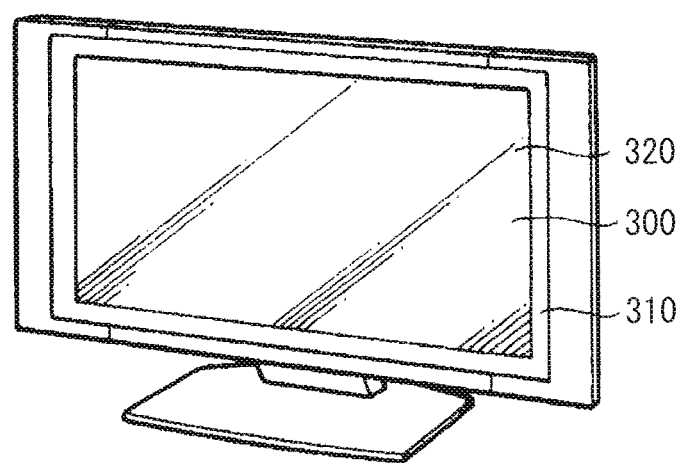
FIG. 28 is a perspective diagram illustrating appearance of application example 3.

FIG. 28 illustrates appearance of a television unit to which the display unit according to any of the above-described embodiments and Modifications is applied. The television unit may have, for example, an image display screen section 300 including a front panel 310 and filter glass 320. The image display screen section 300 is configured of the display unit according to any of the above-described embodiments and Modifications.

Application Example 4

Figure 29A:
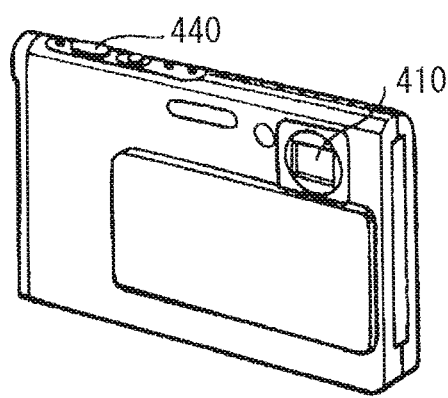
FIG. 29A is a perspective diagram illustrating appearance of application example 4 as viewed from its front side.
Figure 29B:
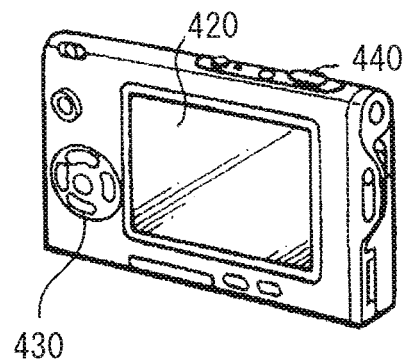
FIG. 29B is a perspective diagram illustrating appearance of the application example 4 as viewed from its back side.

FIGS. 29A and 29B each show appearance of a digital camera to which the display unit according to any of the above-described embodiments and Modifications is applied. The digital camera may have, for example, a light emitting section 410 for flash, a display section 420, a menu switch 430, and a shutter button 440. The display section 420 is configured of the display unit according to any of the above-described embodiments and Modifications.

Application Example 5

Figure 30:
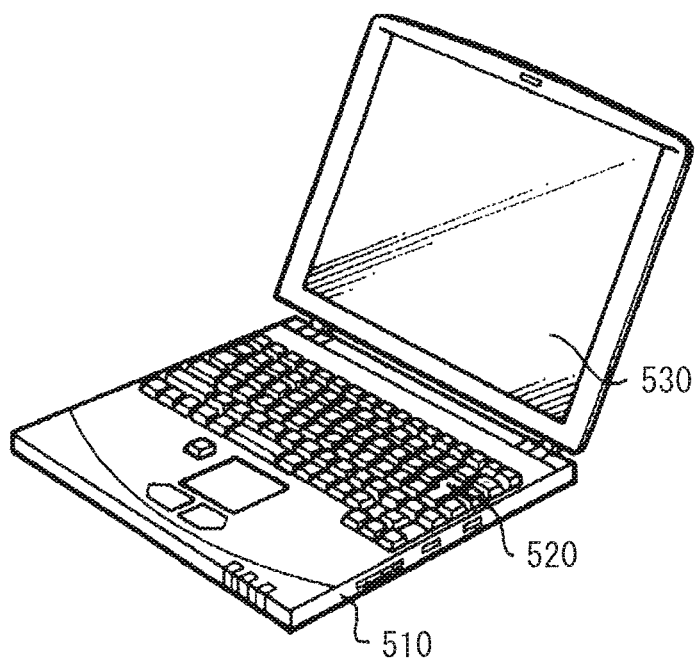
FIG. 30 is a perspective diagram illustrating appearance of application example 5.

FIG. 30 illustrates appearance of a notebook personal computer to which the display unit according to any of the above-described embodiments and Modifications is applied. The notebook personal computer may have, for example, a main body 510, a keyboard 520 for input operation of characters and the like, and a display section 530 that displays images. The display section 530 may be configured of the display unit according to any of the above-described embodiments and Modifications.

Application Example 6

Figure 31:
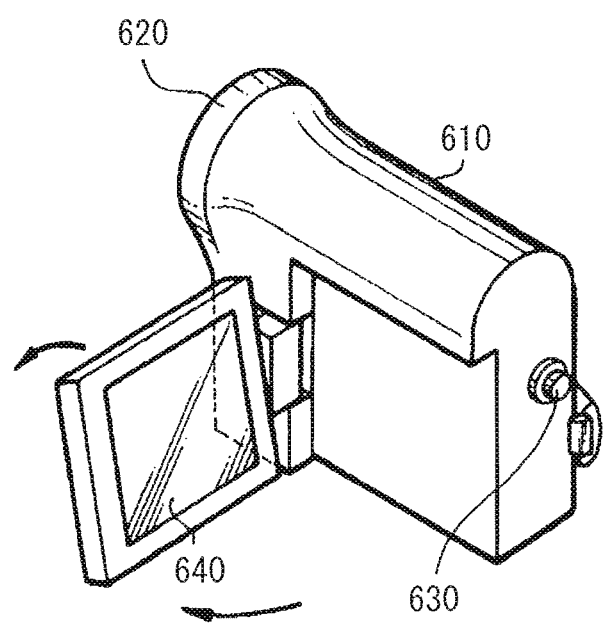
FIG. 31 is a perspective diagram illustrating appearance of application example 6.

FIG. 31 illustrates appearance of a video camcorder to which the display unit according to any of the above-described embodiments and Modifications is applied. The video camcorder may have, for example, a main body section 610, an object-shooting lens 620 provided on a front side face of the main body section 610, a start/stop switch 630 for shooting, and a display section 640. The display section 640 is configured of the display unit according to any of the above-described embodiments and Modifications.

Application Example 7

Figure 32A:
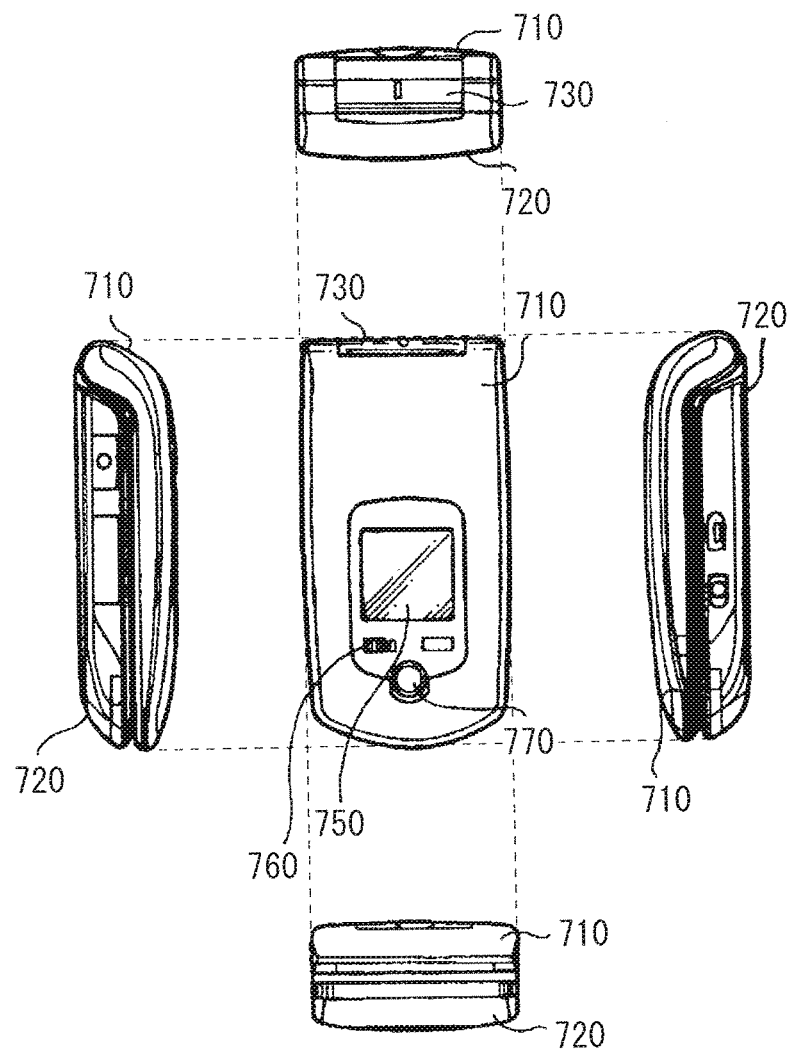
FIG. 32A is a diagram illustrating a closed state of application example 7.
Figure 32B:
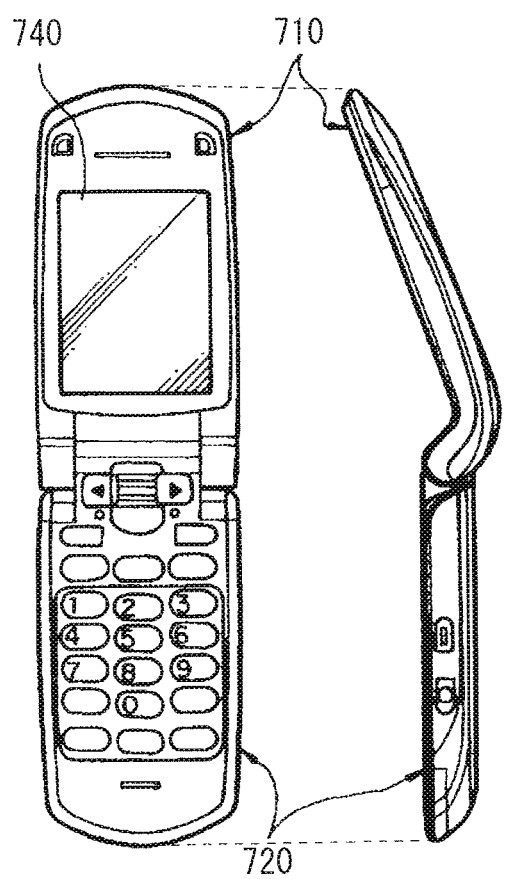
FIG. 32B is a diagram illustrating an opened state of the application example 7.

FIGS. 32A and 32B each illustrate appearance of a mobile phone to which the display unit according to any of the above-described embodiments and Modifications is applied.

For example, the mobile phone may be configured of an upper housing 710 and a lower housing 720 connected to each other by a hinge section 730, and may have a display 740, a sub display 750, a picture light 760, and a camera 770. The display 740 or the sub display 750 may be configured of the display unit according to any of the above-described embodiments and Modifications.

Although the technology of the present disclosure has been described with the example embodiments and the modifications thereof hereinbefore, the technology of the present disclosure is not limited to the above-described embodiments and the like, and various modifications or alterations may be made. For example, although the above-described embodiments and the like have been described with an exemplary case where all the organic light emitting elements 10R, 10G, and 10B have the common organic layer 16, one of the layers of the organic layer 16 may be common to the organic light emitting elements 10R, 10G, and 10B, or the layers of the organic layer 16 may be separately applied for each of the organic light emitting elements 10R, 10G, and 10B.

Moreover, although the above-described embodiments and the like have been described with an exemplary case where the red light emitting layer, the green light emitting layer, and the blue light emitting layer are stacked to generate white light, the light emitting layers may have any configuration, for example, a configuration including a blue light emitting layer and a yellow light emitting layer being stacked.

Furthermore, although the above-described embodiments and the like have been described with an exemplary case where the red filter 23R, the green filter 23G, and the blue filter 23B are provided as the color filter 23 to arrange sub pixels of red, green, and blue, a white or yellow filter may be provided in addition to such filters.

In addition, although the above-described embodiments and the like have been described with an exemplary case where the auxiliary electrode 24 (or the auxiliary electrode 24A, 24B, or 24C) includes the three films (the films 24-1, 24-2, and 24-3), the auxiliary electrode may be configured of two films or four or more films. Furthermore, although a case where the auxiliary electrode 24A has films of which the Young's moduli or the film densities are different from one another, and a case where the auxiliary electrode 24B has films of which the thicknesses are different from one another have been exemplified, the auxiliary electrode may have films of which the Young's moduli and the film densities are different from one another, or the auxiliary electrode may have films of which the Young's moduli, or the film densities are different from one another, and the thicknesses are different from one another.

It is to be noted that the effects described in this specification are merely exemplified and not limitative, and other effects may be shown.

It is possible to achieve at least the following configurations from the above-described example embodiments and the modifications of the disclosure.

(1) A display unit, including:
   a first substrate and a second substrate opposed to each other;
   a display element having a first electrode and a second electrode on the first substrate;
   an auxiliary electrode provided on a surface facing the first substrate of the second substrate, and including a plurality of films stacked in a direction from the second substrate to the first substrate; and
   a plurality of pillars configured to electrically connect the auxiliary electrode to the second electrode.

(2) The display unit according to (1), wherein the display element includes a light emitting layer between the first electrode and the second electrode, and has the first electrode, the light emitting layer, and the second electrode in this order on the first substrate.

(3) The display unit according to (1) or (2), wherein one end of any of the pillars is in contact with one or more of the films, and the other end of any of the pillars is in contact with the second electrode.

(4) The display unit according to any one of (1) to (3), wherein thicknesses of the films included in the auxiliary electrode are in decreasing order along a direction from the second substrate to the first substrate.

(5) The display unit according to any one of (1) to (4), wherein densities of the films included in the auxiliary electrode are in decreasing order along a direction from the second substrate to the first substrate.

(6) The display unit according to any one of (1) to (5), wherein Young's moduli of the films included in the auxiliary electrode are in decreasing order along a direction from the second substrate to the first substrate.

(7) The display unit according to any one of (1) to (6), wherein each of the films included in the auxiliary electrode has a plurality of openings.

(8) The display unit according to (7), wherein Open area ratios of the films are in increasing order along a direction from the second substrate to the first substrate.

(9) The display unit according to any one of (1) to (8), wherein the auxiliary electrode has a space between adjacent two of the films.

(10) The display unit according to any one of (1) to (9), wherein the films included in the auxiliary electrode are fixed to one another.

(11) The display unit according to any one of (1) to (10), wherein the pillars are inclined to respective surfaces of the first substrate and the second substrate.

(12) The display unit according to any one of (1) to (11), further including a buffer layer between the auxiliary electrode and the second substrate.

(13) A display unit, including:
   a first substrate and a second substrate opposed to each other;
   a display element having a first electrode and a second electrode on the first substrate;
   an auxiliary electrode provided on a surface facing the first substrate of the second substrate; and
   a plurality of pillars that are inclined to respective surfaces of the first substrate and the second substrate, and configured to electrically connect the auxiliary electrode to the second electrode.

(14) The display unit according to (13), wherein one end of any of the pillars is provided in a resin layer provided on one or both of the first substrate and the second substrate.

(15) The display unit according to (13) or (14), further including a buffer layer between the auxiliary electrode and the second substrate.

(16) A display unit, including:
   a first substrate and a second substrate opposed to each other;
   a display element having a first electrode and a second electrode on the first substrate;
   an auxiliary electrode provided on a surface facing the first substrate of the second substrate;
   a buffer film between the auxiliary electrode and the second substrate; and
   a plurality of pillars configured to electrically connect the auxiliary electrode to the second electrode.

(17) The display unit according to (16), wherein the buffer film includes a resin material.

(18) An electronic apparatus, including
a display unit,
the display unit including
a first substrate and a second substrate opposed to each other,
a display element having a first electrode and a second electrode on the first substrate,
an auxiliary electrode provided on a surface facing the first substrate of the second substrate, and including a plurality of films stacked in a direction from the second substrate to the first substrate, and
a plurality of pillars configured to electrically connect the auxiliary electrode to the second electrode.

(19) An electronic apparatus, including
a display unit,
the display unit including
a first substrate and a second substrate opposed to each other,
a display element having a first electrode and a second electrode on the first substrate,
an auxiliary electrode provided on a surface facing the first substrate of the second substrate; and
a plurality of pillars that are inclined to respective surfaces of the first substrate and the second substrate, and configured to electrically connect the auxiliary electrode to the second electrode.

(20) An electronic apparatus, including
a display unit,
the display unit including
a first substrate and a second substrate opposed to each other,
a display element having a first electrode and a second electrode on the first substrate,
an auxiliary electrode provided on a surface facing the first substrate of the second substrate,
a buffer film between the auxiliary electrode and the second substrate, and
a plurality of pillars configured to electrically connect the auxiliary electrode to the second electrode.

It should be understood by those skilled in the art that various modifications, combinations, sub-combinations and alterations may occur depending on design requirements and other factors insofar as they are within the scope of the appended claims or the equivalents thereof.

What is claimed is:

1. A display unit, comprising:
a first substrate and a second substrate opposed to each other;
a display element having a first electrode and a second electrode on the first substrate;
an auxiliary electrode provided on a surface of the second substrate facing the first substrate, and including a plurality of films stacked in a direction from the second substrate to the first substrate; and
a plurality of pillars configured to electrically connect the auxiliary electrode to the second electrode.

2. The display unit according to claim 1, wherein the display element includes a light emitting layer between the first electrode and the second electrode, and has the first electrode, the light emitting layer, and the second electrode in this order on the first substrate.

3. The display unit according to claim 1, wherein one end of any of the pillars is in contact with one or more of the films, and the other end of any of the pillars is in contact with the second electrode.

4. The display unit according to claim 1, wherein thicknesses of the films included in the auxiliary electrode are in decreasing order along a direction from the second substrate to the first substrate.

5. The display unit according to claim 1, wherein densities of the films included in the auxiliary electrode are in decreasing order along a direction from the second substrate to the first substrate.

6. The display unit according to claim 1, wherein Young's moduli of the films included in the auxiliary electrode are in decreasing order along a direction from the second substrate to the first substrate.

7. The display unit according to claim 1, wherein each of the films included in the auxiliary electrode has a plurality of openings.

8. The display unit according to claim 7, wherein Open area ratios of the films are in increasing order along a direction from the second substrate to the first substrate.

9. The display unit according to claim 1, wherein the auxiliary electrode has a space between adjacent two of the films.

10. The display unit according to claim 1, wherein the films included in the auxiliary electrode are fixed to one another.

11. The display unit according to claim 1, wherein the pillars are inclined to respective surfaces of the first substrate and the second substrate.

12. The display unit according to claim 1, further comprising a buffer layer between the auxiliary electrode and the second substrate.

13. A display unit, comprising:
a first substrate and a second substrate opposed to each other;
a display element having a first electrode and a second electrode on the first substrate;
an auxiliary electrode provided on a surface of the second substrate facing the first substrate; and
a plurality of pillars that are inclined to respective surfaces of the first substrate and the second substrate, and configured to electrically connect the auxiliary electrode to the second electrode.

14. The display unit according to claim 13, wherein one end of any of the pillars is provided in a resin layer provided on one or both of the first substrate and the second substrate.

15. The display unit according to claim 13, further comprising a buffer layer between the auxiliary electrode and the second substrate.

16. A display unit, comprising:
a first substrate and a second substrate opposed to each other;
a display element having a first electrode and a second electrode on the first substrate;
an auxiliary electrode provided on a surface of the second substrate facing the first substrate;
a buffer film between the auxiliary electrode and the second substrate; and
a plurality of pillars configured to electrically connect the auxiliary electrode to the second electrode.

17. The display unit according to claim 16, wherein the buffer film includes a resin material.

18. An electronic apparatus, comprising
a display unit,
the display unit including
a first substrate and a second substrate opposed to each other,
a display element having a first electrode and a second electrode on the first substrate,
an auxiliary electrode provided on a surface of the second substrate facing the first substrate, and including a plurality of films stacked in a direction from the second substrate to the first substrate, and
a plurality of pillars configured to electrically connect the auxiliary electrode to the second electrode.

19. An electronic apparatus, comprising
a display unit,
the display unit including
a first substrate and a second substrate opposed to each other,
a display element having a first electrode and a second electrode on the first substrate,
an auxiliary electrode provided on a surface of the second substrate facing the first substrate; and
a plurality of pillars that are inclined to respective surfaces of the first substrate and the second substrate, and configured to electrically connect the auxiliary electrode to the second electrode.

20. An electronic apparatus, comprising
a display unit,
the display unit including
a first substrate and a second substrate opposed to each other,
a display element having a first electrode and a second electrode on the first substrate,
an auxiliary electrode provided on a surface of the second substrate facing the first substrate,
a buffer film between the auxiliary electrode and the second substrate, and
a plurality of pillars configured to electrically connect the auxiliary electrode to the second electrode.

* * * * *